(12) United States Patent
Najafi et al.

(10) Patent No.: US 10,740,686 B2
(45) Date of Patent: Aug. 11, 2020

(54) STOCHASTIC COMPUTATION USING PULSE-WIDTH MODULATED SIGNALS

(71) Applicant: Regents of the University of Minnesota, Minneapolis, MN (US)

(72) Inventors: Mohammadhassan Najafi, Minneapolis, MN (US); Shiva Jamalizavareh, Minneapolis, MN (US); David J. Lilja, Maplewood, MN (US); Marcus Riedel, Minneapolis, MN (US); Kiarash Bazargan, Plymouth, MN (US); Ramesh Harjani, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 254 days.

(21) Appl. No.: 15/869,453

(22) Filed: Jan. 12, 2018

(65) Prior Publication Data
US 2018/0204131 A1    Jul. 19, 2018

Related U.S. Application Data

(60) Provisional application No. 62/446,024, filed on Jan. 13, 2017.

(51) Int. Cl.
*G06N 7/00*     (2006.01)
*G06F 7/58*     (2006.01)
(Continued)

(52) U.S. Cl.
CPC .............. *G06N 7/005* (2013.01); *G06F 7/582* (2013.01); *G06J 1/00* (2013.01); *H03K 7/08* (2013.01); *G06N 3/0472* (2013.01)

(58) Field of Classification Search
CPC ...... H03K 3/00–01; H03K 3/017; H03K 7/00; H03K 7/06; H03K 7/08; H03K 9/06; H03K 9/08
See application file for complete search history.

(56) References Cited

U.S. PATENT DOCUMENTS 5,412,587 A    5/1995  Holt et al.
6,745,219 B1   6/2004  Zelkin
(Continued)

FOREIGN PATENT DOCUMENTS

CN        104615406        5/2013

OTHER PUBLICATIONS

Yamanaka, T. & Morie, T. & Nagata, M. & Iwata, A., "A CMOS stochastic associative processor using PWM chaotic signals", IEICE Transactions on Electronics, pp. 1723-1729, 2001 (Year: 2001).*

(Continued)

*Primary Examiner* — Matthew D Sandifer
(74) *Attorney, Agent, or Firm* — Shumaker & Sieffert, P.A.

(57) ABSTRACT

Devices and techniques are described in which stochastic computation is performed on analog periodic pulse signals instead of random, stochastic digital bit streams. Exploiting pulse width modulation (PWM), time-encoded signals corresponding to specific values are generated by adjusting the frequency (period) and duty cycles of PWM signals. With this approach, the latency, area, and energy consumption are all greatly reduced, as compared to prior stochastic approaches. Circuits synthesized with the proposed approach can work as fast and energy efficiently as a conventional binary design while retaining the fault-tolerance and low-cost advantages of conventional stochastic designs.

20 Claims, 17 Drawing Sheets

(51) Int. Cl.
H03K 7/08 (2006.01)
G06J 1/00 (2006.01)
G06N 3/04 (2006.01)

(56) References Cited

U.S. PATENT DOCUMENTS

| | | | |
|---|---|---|---|
| 7,095,439 | B2 | 8/2006 | Hammadou |
| 7,424,500 | B2 | 9/2008 | Fukushima et al. |
| 7,634,749 | B1 | 12/2009 | Cortadella et al. |
| 8,645,286 | B2 | 2/2014 | Jonas et al. |
| 9,646,243 | B1 | 5/2017 | Gokmen |
| 2006/0155551 | A1 | 7/2006 | Ueda |
| 2007/0110300 | A1 | 5/2007 | Chang |
| 2008/0294970 | A1 | 11/2008 | Gross et al. |
| 2009/0228238 | A1 | 9/2009 | Mansinghka et al. |
| 2011/0154150 | A1 | 6/2011 | Kang et al. |
| 2011/0231731 | A1 | 9/2011 | Gross et al. |
| 2013/0007551 | A1 | 1/2013 | Krishnan et al. |
| 2013/0124164 | A1 | 5/2013 | Jha et al. |
| 2014/0081899 | A1 | 3/2014 | Jonas et al. |
| 2017/0109628 | A1 | 4/2017 | Gokmen et al. |
| 2017/0188174 | A1 | 6/2017 | Lee et al. |
| 2017/0192752 | A1 | 7/2017 | Bradbury et al. |
| 2017/0255225 | A1 | 9/2017 | Lilja et al. |
| 2017/0359082 | A1 | 12/2017 | Riedel et al. |
| 2018/0196642 | A1 | 7/2018 | Droulez et al. |

OTHER PUBLICATIONS

Alaghi et al., "Fast and Accurate Computation using Stochastic Circuits," Design Automation and Test in Europe Conference and Exhibition, Mar. 24-28, 2014, IEEE online Apr. 21, 2014, 4 pp.
Alaghi et al., "Stochastic Circuits for Real-Time Image-Processing Applications," Proceedings of the 50th Annual Design Automation Conference, May 29-Jun. 7, 2013, 6 pp.
Alaghi et al., "Survey of Stochastic Computing," ACM Transactions on Embedded Computing Systems, vol. 12, No. 2s, Article 92, May 2013, 19 pp.
Chapiro, "Globally-Asynchronous Locally-Synchronous Systems," Dissertation submitted to the Department of Computer Science, Report No. STAN-CS-84-1026, Stanford University, Oct. 1984, 138 pp.
Choi et al., A Magnetic Tunnel Junction Based True Random Number Generator with Conditional Perturb and Real-Time Output Probability Tracking, Electron Devices Meeting, Dec. 15-17, 2014, available from IEEE Feb. 23, 2015, 4 pp.
Friedman, "Clock Distribution Networks in Synchronous Digital Integrated Circuits," IEEE, vol. 89, No. 5, May 2001, 28 pp.
Gaines, "Stochastic Computing Systems, Chapter 2," Advances in Information System Science, 1969, 69 pp. (Applicant points out, in accordance with MPEP 609.04(a), that the year of publication, 1969, is sufficiently earlier than the effective U.S. filing date, Mar. 3, 2017, so that the particular month of publication is not in issue.).
Jenson et al., "A Deterministic Approach to Stochastic Computation," submitted to the 2016 International Conference on Computer Aided Design, Jun. 10, 2016, 8 pp.
Jiang et al., "Design of Mixed Synchronous/Asynchronous Systems with Multiple Clocks," IEEE Transactions on Parallel and Distributed Systems, vol. 26, No. 8, Aug. 2015, 14 pp.
Li et al., "A Low Power Fault-Tolerance Architecture for the Kernal Density Estimation Based Image Segmentation Algorithm," International Conference on Application Specific Systems, Architectures and Processors, Sep. 11-14, 2011, available from IEEE Oct. 13, 2011, 8 pp.
Li et al., "A Stochastic Reconfigurable Architecture for Fault-Tolerant Computation with Sequential Logic," 30th International Conference on Computer Design, IEEE, Sep. 30-Oct. 3, 2012, 6 pp.
Li et al., "An FPGA Implementation of a Restricted Boltzmann Machine Classifier Using Stochastic Bit Streams," Sep. 10, 2015, 2 pp.

Li et al., "Computation on Stochastic Bit Streams Digital Image Processing Case Studies,"Transactions on Very Large-Scale Integration (VLSI) Systems, vol. 22, Issue 3, Mar. 2014, available from IEEE Apr. 15, 2013, 14 pp.
Li et al., "The Synthesis of Complex Arithmetic Computation on Stochastic Bit Streams Using Sequential Logic," International Conference on Computer-Aided Design, Nov. 2012, 9 pp.
Liang et al., "Stochastic Modeling and Optimization in a Microgrid: A Survey,"Energies, Mar. 31, 2014, 24 pp.
Mansinghka et al., "Stochastic Digital Circuits for Probabilistic Inference," Computer Science and Artificial Intelligence Laboratory Technical Report, Massachusetts Institute of Technology, Nov. 23, 2008, 12 pp.
Naderi et al., "Delayed Stochastic Decoding of LDPC Codes," Transactions on Signal Processing, vol. 59, No. 11, IEEE, Nov. 2011, 10 pp.
Najafi et al., "A Fast Fault-Tolerant Architecture for Sauvola Local Image Thresholding Algorithm Using Stochastic Computing," Transactions on Very Large Scale Integration (VLSI) Systems, vol. 24. No. 2, IEEE, Feb. 2016, 5 pp.
Najafi et al., "Polysynchronous Stochastic Circuits," 21 Asia and South Pacific Design Automation Conference, Jan. 25-28, 2016, IEEE, 7 pp.
Brown et al., "Stochastic Neural Computation I: Computational Elements," IEEE Transactions on Computers, vol. 50, Issue 9, Sep. 2001, 15 pp.
Najafi et al., "Polysynchrous Clocking: Exploiting the Skew Tolerance of Stochastic Circuits," IEEE Transactions on Computers, vol. PP, Issue 99, Apr. 25, 2017, 11 pp.
Qian et al., "An Architecture for Fault-Tolerant Computation with Stochastic Logic," IEEE, Feb. 2011, 14 pp.
Qian et al., "Digital yet Deliberately Random: Synthesizing Logical Computation on Stochastic Bit Streams," Dissertation from the University of Minnesota, Jul. 2011, 185 pp.
Qian et al., "Synthesizing Logical Computation on Stochastic Bit Streams," Proceedings of IEEE, 2011, (Applicant points out, in accordance with MPEP 609.04(a), that they year of publication 2011, is sufficiently earlier than the effective U.S. filing date, so that they particular month of publication is not in issue.) 8 pp.
Qian et al., "The Synthesis of Robust Polynomial Arithmetic with Stochastic Logic," 45 Conference of Design Automation, IEEE, Jun. 8-13, 2008, 6 pp.
Qian et al., "The Synthesis of Stochastic Circuits for Nanoscale Computation: Chapter 18," International Journal of Nanotechnology and Molecular Computation, Oct.-Dec. 2009, 16 pp.
Ranjbar et al., "Using Stochastic Architectures for Edge Detection Algorithms," 23rd Iranian Conference on Electrical Engineering, May 10-14, 2015, available from IEEE Jul. 2, 2015, 6 pp.
Riedel, "Polysynchronous Clocking for Molecular Computing," MBMC Workshop, Dec. 4, 2015, 37 pp.
Tang et al., "True Random Number Generator Circuits Based on Single- and Multi-Phase Beat Frequency Detection," Proceedings of the Custom Integrated Circuits Conference, Sep. 15-17, 2014, available from IEEE Nov. 6, 2014, 4 pp.
Tehrani et al., Fully Parallel Stochastic LDPC Decoders, Transactions on Signal Processing, vol. 56, No. 11, IEEE, Nov. 2008, 12 pp.
Tehrani et al., "Majority-Based Tracking Forecast Memories for Stochastic LDPC Decoding," Transactions on Signal Processing, vol. 58, No. 9, IEEE, Sep. 2010, 14 pp.
Tehrani et al., "Stochastic Decoding of LDPC Codes," Communications Letters, vol. 10. No. 10, IEEE, Oct. 2006, 3 pp.
Wilhelm et al., "Stochastic Switching Circuit Synthesis," Information Theory, Jul. 6-11, 2008, IEEE online Aug. 8, 2008, 16 pp.
Zhu et al., "Binary Stochastic Implementation of Digital Logic," Proceedings of the 2014 AVM/SIGDA International Symposium on Field-programmable Gate Arrays, Feb. 2014, 9 pp.
Jenson et al., "A Deterministic Approach to Stochastic Computation," presentation acceptance at the International Workshop on Logic and Synthesis, Nov. 10, 2016, 8 pp.
Najafi et al., "An Overview of Time-Based Computing with Stochastic Constructs," Ultra-Low-Power Processors, IEEE Computer Society, Nov./Dec. 2017, pp. 62-71.

(56) References Cited

OTHER PUBLICATIONS

Golomb "Signal design for good correlation," 'Chapter 4, Feedback Shift Register Sequences,' Very Large-Scale Integration (VLSI) Systems, IEEE Transactions, 2004, published Jul. 11, 2005, pp. 81-116.

Golomb "Signal design for good correlation," Chapter 5, Signal Design for Good Correlation for Wireless Communication, Cryptography, and Radar, Very Large-Scale Integration (VLSI) Systems, IEEE Transactions, 2004, published Jul. 11, 2005, pp. 117-161.

Ichihara et al., "Compact and accurate stochastic circuits with shared random number sources," In Computer Design (ICCD), 2014 $32^{nd}$ IEEE International Conference, pp. 361-366, Oct. 2014.

Poppelbaum "Stochastic Computing Elements and Systems," Proc. Jt. Computer Conf. Nov. 1967, pp. 635-644.

Alaghi et al., "Trading Accuracy for Energy in Stochastic Circuit Design" J. Emerging Technologies in Computing Systems, vol. 13, No. 3, Apr. 2017, pp. 47-1-47.

Hayes, "Introduction to Stochastic Computing and Its Challenges," Proc. $52^{nd}$ ACM/EDAC/IEEE Design Automation Conf. Jun. 2015, p. 1-3.

International Technology Roadmap for Semiconductors 2.0, 2015, accessed on May 21, 2015 from www.itrs2.net/itrs-reports.html, 78 pp.

Roberts, "a Brief Introduction to Time-to-Digital and Digital-to-Time Converters," IEEE Trans. Circuits and Systems—II, vol. 57, No. 3, Mar. 2010, pp. 153-157.

Najafi et al., "Time-Encoded Values for Highly Efficient Stochastic Circuits," IEEE Trans. Very Large-Scale Integration (VLSI) Systems, vol. 25, No. 5, May 2017, pp. 1644-1657.

Fick et al., "Mixed-Signal Stochastic Computation Demonstrated in an Image Sensor with Integrated 2D Edge Detection and Noise Filtering," Proc. IEEE Custom Integrated Circuits Conf. Nov. 2014, pp. 1-4.

Onizawa et al., "Analog-to-Stochastic Converter using Magnetic Tunnel Junction Devices for Vision Chips," IEEE Trans. Nanotechnology, vol. 15, No. 5, Sep. 2016, pp. 705-714.

Alaghi et al., "Exploiting Correlation in Stochastic Circuit Design," Proc. IEEE $31^{st}$ Int'l Conf. Computer Design, Oct. 2013, 8 pp.

Najafi et al., "Power and Area Efficient Sorting Networks using Unary Processing," Proc. IEEE $35^{th}$ Int'l Conf. Computer Design Nov. 2017, pp. 125-128.

Najafi et al., "A Reconfigurable Architecture with Sequential Logic-Based Stochastic Computing" ACM J. Emerging Technologies in Computing Systems, vol. 13, No. 4, Jun. 2017, 28 pp.

Najafi et al., Polysynchronous clocking: Exploiting the skew tolerance of stochastic circuits, IEEE Transactions on Computers, vol. 66, No. 10, Oct. 2017, pp. 1734-1746.

Alaghi et al., "Stochastic circuits for real-time image-processing applications," in Design Automatic Conference (DAC) 2013 $50^{th}$ ACM/ EDAC /IEEE, May 2013, 6 pp.

Ardakani et al., "Vlsi implementation of deep neural network using integral stochastic computing," IEEE Transactions on Very Large Scale Integration (VLSI) Systems, Oct. 2017, pp. 2688-2699.

Kim, "Dynamic energy-accuracy trade-off using stochastic computing in deep neural networks," in Proceedings of the $53^{rd}$ Annual Design Automation Conference, DAC '16, pp. 124:1-124:6, Jun. 2016.

Li, et al., "Using stochastic computing to reduce the hardware requirements for a restricted Boltzmann machine classifier," in Proceedings of the 2016 ACM/SIGDA International Symposium on Field-Programmable Gate Arrays, FPGA '16, Feb. 2016, pp. 36-41, 2016.

Liu et al., Architectures for recursive digital filters using stochastic computing, IEEE Transactions on Signal Processing, Jul. 2016, pp. 3705-3718.

Murmann, "ADC Performance Survey 1997-2015," [online], accessed on May 21, 2005, available http://web.stanford.edu/murmann/adcsurvey.html, 2015, 58 pp.

Najafi, "High-Speed Stochastic Circuits Using Synchronous Analog Pulses," Proc. $22^{nd}$ Asia and South Pacific Design Automation Conference, Feb. 2017, pp. 481-487.

Tsitsiklis et al., "Distributed Asynchronous Deterministic and Stochastic Gradient Optimization Algorithms," IEEE Transactions on Automatic Control, vol. AC-31, No. 9, Sep. 1986, 10 pp.

Jonas, Eric Michael. "Stochastic architectures for probabilistic computation." PhD diss., Massachusetts Institute of Technology, Feb. 2014. (Year: 2014) 112 pp.

Koopman, "Maximal Length LFSR Feedback Terms," accessed from https://users.ece.cmu.edu/Koopman/lfsr/index.html, Jun. 4, 2018, 3 pp.

Lee et al., "Energy-Efficient Hybrid Stochastic-Binary Neural Networks for Near-Sensor Computing," DATE'17 Proceedings of the Conference on Design, Automation & Test in Europe, Mar. 2017, 6 pp.

Li et al., "A Stochastic Digital Implementation of a Neural Network Controller for Small Wind Turbine Systems," IEEE Transactions on Power Electronics, vol. 21, No. 5, Sep. 2006, 6 pp.

Li et al., "Logical Computation on Stochastic Bit Streams with Linear Finite-State Machines," IEEE Transactions on Computers, vol. 63, No. 6, Jun. 2014, 13 pp.

Li et al., "Neural Network Classifiers using Stochastic Computing with a Hardware-Oriented Approximate Activation Function," 2017 35th IEEE International Conference on Computer Design (ICCD), Nov. 2017, 8 pp.

Mansinghka, Vikash Kumar. "Natively probabilistic computation." PhD diss., Massachusetts Institute of Technology, Department of Brain and Cognitive Sciences, Jun. 2009. (Year: 2009) 136 pp.

Najafi et al., "High Quality Down-Sampling for Deterministic Approaches to Stochastic Computing," IEEE Transactions on Emerging Topics in Computing, Dec. 2017, 7 pp.

Pasca, "Neural Network Digital Hardware Implementation," M.A. Sc. diss., Ottawa-Carleton Institute for Electrical and Computer Engineering-School of Information Technology and Engineering, Dec. 2006, 158 pp.

Cushon et al., "A Min-Sum Iterative Decoder Based on Pulsewidth Message Encoding," IEEE Transactions on Circuits and Systems—II: Express Briefs, vol. 57, No. 11, Nov. 2010, 5 pp.

\* cited by examiner

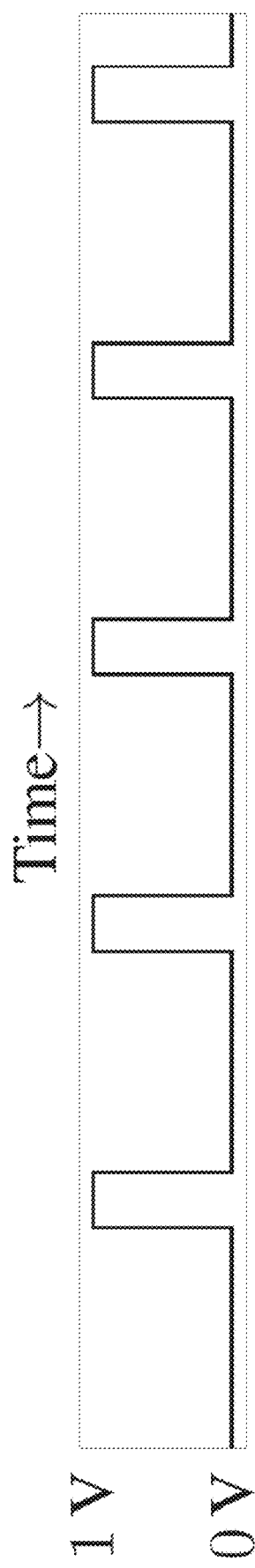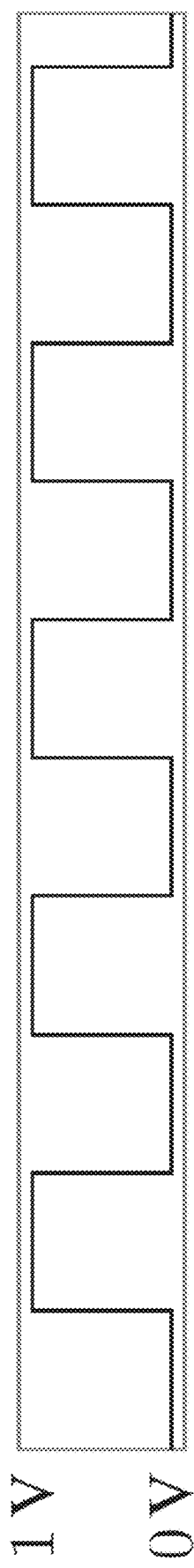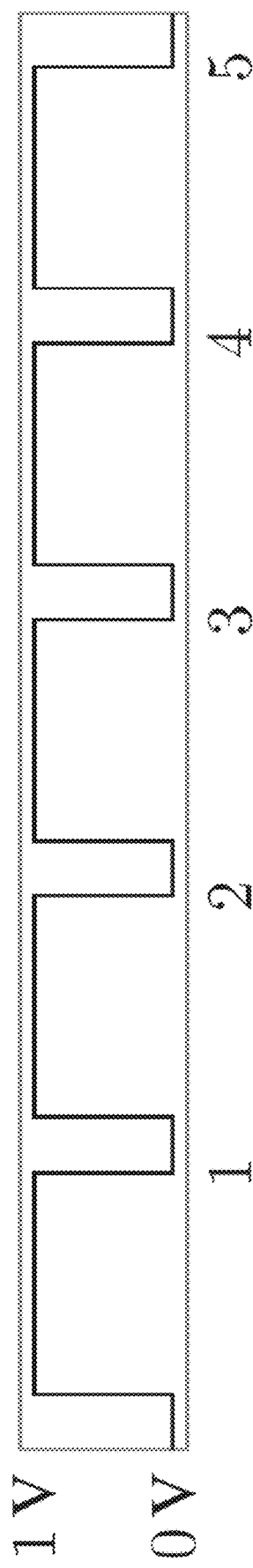

FIG. 17

STOCHASTIC COMPUTATION USING PULSE-WIDTH MODULATED SIGNALS

GOVERNMENT INTEREST

This invention was made with government support under CCF-1408123 awarded by National Science Foundation. The government has certain rights in the invention.

This application claims the benefit of U.S. Provisional Patent Application No. 62/446,024 (filed Jan. 13, 2017), the entire content being incorporated herein by reference.

TECHNICAL FIELD

The invention relates to electronic circuits and, in particular, performing arithmetic operations in electronic circuits.

BACKGROUND

Stochastic computing (SC) has gained traction in recent years again. SC has been applied to a wide variety of applications such as image processing, error correction, and neural networks. In SC, circuits operate on randomized bit streams. The signal value is encoded by the probability of obtaining a one versus a zero in the stream. In the "unipolar" representation, a real-valued number x (0≤x≤1) is represented by a stream in which each bit has probability x of being one and probability (1−x) of being zero. In the "bipolar" representation, a real-valued number y (−1≤y≤1) is represented by a stream in which each bit has probability $$\frac{y+1}{2}$$

of being one and probability $$1 - \frac{y+1}{2}$$

of being zero.

A stochastic representation may be less compact than conventional binary radix. However, complex operations can be performed with remarkably simple logic. For example, a single AND performs multiplication with the unipolar representation; a single XNOR gate performs multiplication with the bipolar representation. A multiplexer implements scaled addition and subtraction. Complex functions, such as exponentials and trigonometric functions, can be computed through polynomial approximations.

In addition to producing simple and compact logic, a stochastic representation offers the advantage of error tolerance. The environment can be noisy: bit flips occur and these afflict all the bits with equal probability. With a conventional binary radix representation, the high-order bits represent a large magnitude; accordingly, faults can produce large errors. In contrast, with a stochastic representation, all the bits are equally weighted. Hence, a single flip results in a small error. This error tolerance scales to high error rates: multiple bit flips produce only small and uniform deviations from the nominal value.

A premise for SC is the availability of stochastic bit streams with the requisite probabilities. In prior work, these stochastic bit streams were generated from physical random sources or with pseudo-random constructs such as linear-feedback shift registers (LFSRs). These stochastic number generator (SNG) modules may contribute heavily to the hardware cost. Indeed, in some cases, they accounted for 80% or more of the overall hardware cost. Consequently, SNGs may consume a significant amount of power. Noting that energy equals power multiplied by time, the long run-time of stochastic circuits, together with the high power consumption of the SNGs, could lead to higher energy use than their conventional binary counterparts.

SUMMARY

This disclosure describes electronic devices, components and systems that incorporate stochastic processing components that operate on stochastic bit streams generated as analog periodic pulse signals. Instead of communicating data to and from the stochastic computation components in the form of random or pseudo-random digital stochastic bit streams, one or more of the bit streams may be communicated as pulse-width modulated signals. Signal generators may be configured to generate and output the signals, for example, by adjusting the frequency (periods) and duty cycles so as to encode values in a manner that allows the encoded analog signals to be utilized with conventional stochastic digital logic components.

In one example, a device includes a stochastic processing unit having a plurality of inputs, wherein each input of the plurality of inputs is configured to receive a respective pulse-width modulated (PWM) signal of a plurality of PWM signals. Each of the PWM signals encodes a respective data value as a function of a duty cycle of the respective PWM signal. The stochastic processing unit includes stochastic processing circuitry configured to operate on the plurality of PWM signals and produce a computational result.

In another example, a sensor device includes a sensing circuit that outputs an analog sense signal indicative of a sensed input and a ramp generator configured to receive the analog sense signal and output a ramp signal up to an output voltage set as a function of the analog sense signal. The sensor device also includes an analog comparator having a first input configured to receive the ramp signal from the ramp generator and a second input configured to receive a reference voltage and configured to output a PWM signal based on a comparison of the ramp signal and the reference voltage. The sensor device further includes a clock signal generator outputting a reset clock to reset the analog comparator and control a period for the PWM signal.

In another example, a method includes generating a plurality of PWM signals, each PWM signal of the plurality of PWM signals having a duty cycle that encodes a respective data value. The method also includes processing the plurality of PWM signals with stochastic processing circuitry configured to operate on the plurality of PWM signals and produce a computational result.

The techniques described herein may provide new, energy-efficient, high-performance, and much less costly approaches for generating and operating on stochastic bit streams using analog periodic pulse signals. As one example, the techniques may be utilized to implement ultra-low-power processors. As other examples, the techniques may be incorporated to provide efficient, low power computation electronic circuits for sensors, image processors, video processing circuitry, cameras, mobile device, or other suitable devices.

BRIEF DESCRIPTION OF DRAWINGS

FIGS. 1A-1C illustrate pulse-width modulated (PWM) signals with different duty cycles, in some examples of this disclosure.

FIG. 17 illustrates two sample images and the outputs of image processing circuitry, in some examples of this disclosure.

DETAILED DESCRIPTION

Figure 1D:
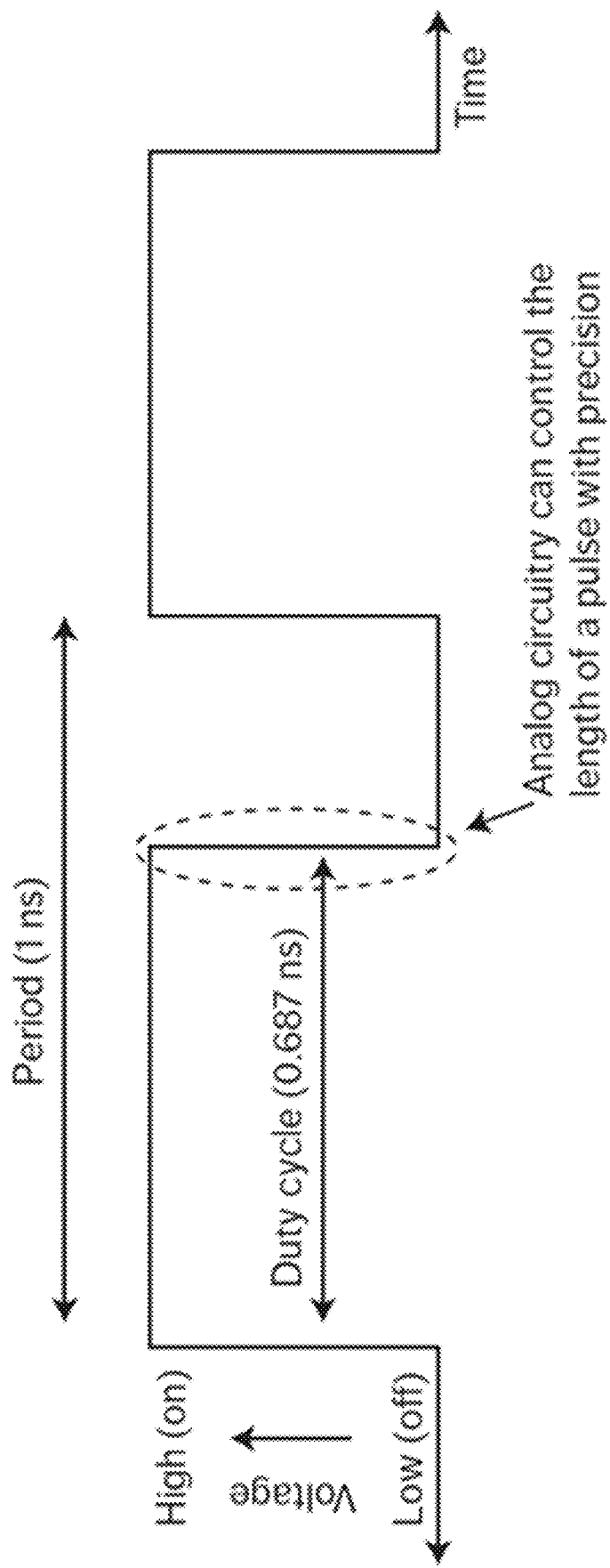
FIG. 1D illustrates encoding in time with a periodic analog signal, in some examples of this disclosure.

The techniques described herein generate stochastic bit streams using analog periodic pulse signals. In example implementations, devices and computing systems may, for example, include stochastic computational logic components. Instead of communicating data to and from the stochastic computation logical components in the form of random or pseudo-random digital stochastic bit streams, one or more of the bit streams may be communicated as pulse-width modulated signals. Signal generators may be configured to generate the signals, for example, by adjusting the frequency and duty cycles so as to encode values in a manner that allows the encoded analog signals to be utilized with conventional stochastic digital logic components.

In various implementations described herein, pulse-width modulated (PWM) signals corresponding to specific values are generated by adjusting the frequency and duty cycles of PWM signals. The duty cycle ($0 \leq D \leq 1$) describes the amount of time the signal is in the high (on) state as a percentage of the total time it takes to complete one cycle. As a result, the signal is encoded in time. The frequency, which is the inverse of time period T, of the PWM signal determines how long it takes to complete a cycle T and, therefore, how fast it switches between the high and the low states. Thus, a PWM signal $f(t)$ is defined as shown in Equation (1).

$$f(t) = \begin{cases} y_{high} & N \cdot T < t \leq N \cdot T + (1-D) \cdot T \\ y_{low} & N \cdot T + (1-D) \cdot T < t \leq (N+1) \cdot T \end{cases} \quad (1)$$

where $y_{high}$ and $y_{low}$ are the high and low values of the signal, N=0, 1, 2, . . . are the consecutive PWM cycles, and D is the duty cycle. FIGS. 1A-1C show three PWM signals with different duty cycles D when T equals one, $y_{high}$ equals one volt, and $y_{low}$ equals zero volts.

As described herein, a stochastic representation may be viewed as a uniform, fractional representation. Moreover, in stochastic computing, a data value is represented by the fraction of the time a signal is high. For example, if a signal is high 25% of the time, it is evaluated as 0.25 in the unipolar format. Similarly, PWM signals can be treated as time-encoded inputs with values defined by their duty cycle. For example, the PWM signals shown in FIGS. 1A-1C represent 0.2, 0.5, and 0.8 in the unipolar and −0.6, zero, and 0.6 in the bipolar representation.

One challenge is that PWM signals are not, in themselves, random or pseudo-random. Consider the stochastic operation of multiplication with a single AND gate. Taking the logical AND of bits in two independent bit streams yields the product of their probabilities, so an AND gate performs multiplication on stochastic bit streams. With PWM signals, the duty cycle represents or encodes the respective data value. If two PWM signals have the same frequency, then the scheme will not work; the logical AND of the signals will not compute the product of the values. The techniques herein may choose different frequencies, and operate over multiple PWM cycles. With the appropriate choice of frequencies for input signals, the high values intersect roughly as they would randomly. Thus, example implementations described herein achieve an inexpensive form of pseudo-randomness with PWM signals.

FIG. 1D illustrates encoding in time with a periodic analog signal, in some examples of this disclosure. The encoded value may be represented by the fraction of the time that the signal is high in each cycle. In the illustrated case, the encoded value is 0.687 because the signal is high for 0.687 nanoseconds out of a period of one nanosecond. The encoding may occur in the time domain of a PWM signal, which may encode a data value (e.g., 0.687) as a function of the duty cycle of the PWM signal.

As technology has scaled and device sizes have gotten smaller, the supply voltages have dropped while the device speeds have improved. Control of the dynamic range of signals in the voltage domain is limited. However, control of the length of pulses in the time domain, as described herein, can be precise. As such, as encoding data in the time domain may be more accurate and efficient than converting signals into binary radix.

This time-based representation may be an excellent fit for low-power processors or electronic applications that include time-based sensors, such as image processing circuits in vision chips. Converting a variety of signals from an external voltage to a time-based representation can be done much more efficiently than a full conversion to binary radix. This approach may enable a savings of at least ten times in power at the outset.

As one example implementation, this disclosure describes techniques for performing computation on time-encoded analog values directly with, as one example, ordinary complimentary metal-oxide-semiconductor (CMOS) digital logic. This technique is similar to a deterministic approach to stochastic computing. If properly structured, computation on deterministic bitstreams can be performed with the same circuits as are used in stochastic computing, yielding the following benefits. First, unlike stochastic methods, the deterministic methods described in this disclosure produce completely accurate results, not approximations, with no errors or fluctuations. Second, the cost of generating deterministic streams may be a small fraction of the cost of generating bit streams from random or pseudorandom sources. Third, most importantly, the latency may be reduced by a factor of ($½^n$), where n is the equivalent number of bits of precision in binary. Computation on signals encoded in time is directly analogous to the deterministic approach to stochastic computing.

Figure 2:
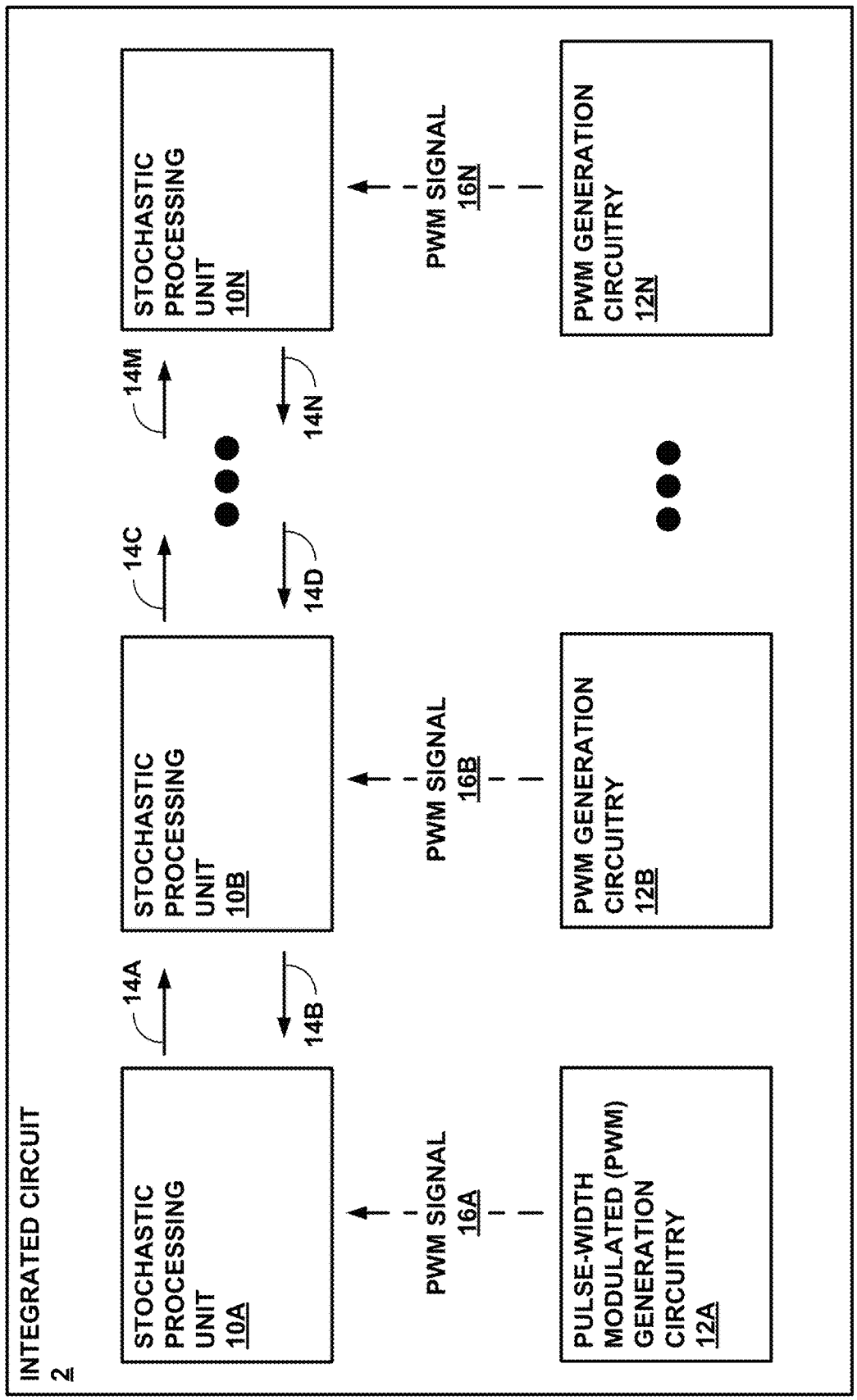
FIG. 2 is a conceptual block diagram illustrating stochastic processing units configured to process PWM signals, in some examples of this disclosure.

FIG. 2 is a conceptual block diagram illustrating an integrated circuit 2 having stochastic processing units 10A-10N configured to process bit streams that are encoded as PWM signals 14A-14N and/or 16A-16N, in some examples of this disclosure. Integrated circuit 2 may be part of or include a sensor, an image processor, a video processing circuitry, a camera, a mobile device, or another suitable device.

In this example, each of stochastic processing units 10A-10N represents a functional component, e.g., a processing unit and/or a digital logic unit, designed to perform operations, such as arithmetic operations, image processing, video processing, signal processing, and the like. Each of stochastic processing units 10A-10N may include stochastic processing circuitry such one or more logic gates (e.g., AND gates, OR gates, XOR gates, etc.), transistors, resistors, capacitors, diodes, and/or any other suitable components. Stochastic processing units 10A-10N may include stochastic computational logic circuits configured to operate on PWM signals 14, 16 as if the signals were digital stochastic bit streams.

As shown in the example of FIG. 2, stochastic processing units 10A-10N may include output logic in the form of bit stream generators configured to output data via PWM signals 14A-14N. For example, stochastic processing unit 10A may output PWM signal 14A to stochastic processing unit 10B, where it may serve as an input PWM signal carrying operands representing numerical values. Each stochastic processing unit 10 may have a plurality of inputs (e.g., input nodes), where each input is configured to receive a PWM signal of PWM signals 14A-14N and PWM signals 16A-16N. Stochastic processing unit 10B may utilize PWM signals 14A and 14D as inputs and may generate PWM signals 14B and 14C as outputs. In general, each stochastic processing unit 10 may receive multiple PWM signals 14 as input signals and produce one or more output signals indicative of the results of the operations.

Each stochastic processing unit 10 may also receive one or more of PWM signals 16A-16N from other sources having PWM generation circuitry 12A-12N, such as memory, sensors, busses, input/output (I/O) devices and the like. The circuitry of FIGS. 3-6A are examples of PWM generation circuitry 12A-12N. PWM generation circuitry 12A-12N may be configured to generate PWM signals 16A-16N by controlling the duty cycle of each of PWM signals 16A-16N to encode a data value. PWM generation circuitry 12A-12N may be configured to repeatedly output a full duty cycle of one of PWM signals 16A-16N representing a data value over a time duration. For example, for a period of two nanoseconds and a duty cycle of fifty percent, PWM generation circuitry 12A may output ten cycles of PWM signal 16A in twenty nanoseconds, where each cycle has a low interval of one nanosecond and a high interval of one nanosecond.

As one example, PWM signals 14 and 16 may use a set of zeroes and ones to express a fractional number between zero and one. For example, a PWM signal may comprise a signal that is digital in value (e.g, 0 volts=low, 1 volt=high) but analog in time such that a data value is encoded in time by setting the duty cycle and/or frequency of the PWM signal, such as shown in FIGS. 1A-1D. For example, as continuous-valued time signals, one of PWM signals 14 or 16 of FIG. 2 may be generated with a 60% duty cycle to encode a value 0.6. This continuous-valued time signal may be received and operated on as a digital, stochastic signal by stochastic processing units 10 as a five-bit sequence of 1,1,1,0,0 that represents the value 0.6 because sixty percent of the bits are one. Thus, PWM signals 14, 16 may be generated and output by PWM generation circuitry 12 or stochastic processing units 10 by manipulating the duty cycles and/or frequencies of the modulated signals to encode values such that, when processed as input bit streams by stochastic computation logic, the PWM signals may be operated on as if stochastic signals in which for any set of N bits, the probability that any bit in the set of bits is one corresponds to the value being encoded.

In example implementations, as described herein, unlike conventional stochastic processing devices that utilize random number generators to output stochastic-encoded bit streams in which individual bit values are random or pseudo-randomly generated, components of integrated circuit 2 may generate PWM signals 14 and 16 using a deterministic, i.e., known or repeatable, encoding scheme. Furthermore, techniques are described herein by which PWM signals 14 and 16 are processed by stochastic processing circuitry within stochastic processing units 10A-10N. That is, each of the stochastic processing units may nevertheless operate on PWM signals using stochastic circuitry of stochastic processing units 10A-10N even though the PWM signals need not necessarily be random or pseudo random in nature, which has typically been a requirement for devices utilizing stochastic processing circuits. In this way, the techniques may provide energy-efficient, high-performance, and much less costly approach for generating stochastic bit streams and making use of stochastic processing circuitry using analog periodic pulse signals.

Figure 3:
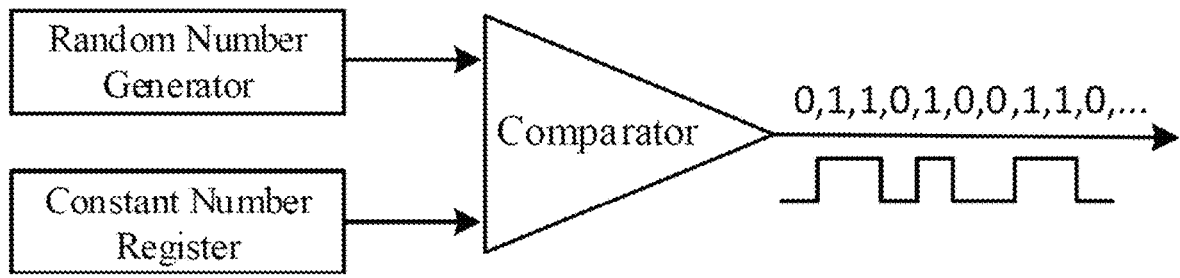
FIGS. 3 and 4 illustrate stochastic number generators, in some examples of this disclosure.

Given an input value, say in binary radix, the conventional approach for generating a stochastic bit stream with probability x is as follows. Obtain an unbiased random value $0 \leq r \leq 1$ from a random or pseudorandom source; compare it to the target value x; output a one if r is less than or equal to x and a zero otherwise. FIG. 3 illustrates the typical approach for generating a stochastic bit stream. The "random number generator" is usually an LFSR, which produces high quality pseudo-randomness. In this approach, the period of the clock feeding the generator corresponds to the duration of a single bit in the output stream. Assuming that the pseudorandom numbers are uniformly distributed between zero and $2^M-1$, the value stored in the constant number register should be $2^M \times x$. In the output, each bit is one with probability $(2^M \times x)/2^M = x$.

Pseudo-random number generators contribute heavily to the overall hardware cost of a stochastic system. To represent real numbers with a resolution of $2^M$, i.e. numbers of the form $$\frac{a}{2^M}$$

for integers a between zero and $2^M$, a stochastic representation requires a stream of $2^M$ bits. Generating streams with such resolution requires a generator that can produce $2^M$ unique values. Indeed, the high cost of the pseudo-random number generation diminishes one of the main advantages of SC: low hardware cost. Factoring in the cost of the generators, the overall hardware cost of an SC implementation is often comparable to that of a conventional representation.

Figure 4:
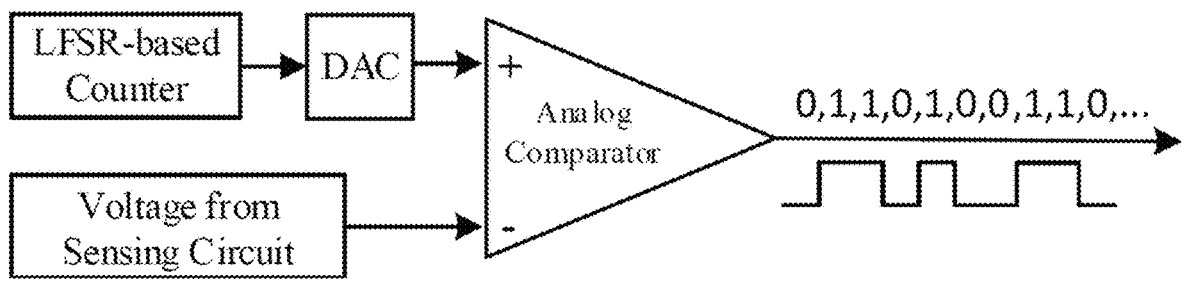

FIG. 4 illustrates another example of a stochastic number generation that can be found in an article by Alaghi et al., entitled "Stochastic circuits for real-time image-processing applications" presented in 50th Design Automation Conference (DAC) in May 2013 (hereinafter "Alaghi"), which is incorporated herein by reference in its entirety. However, by working with PWM signals as described herein, much less costly SNG can be achieved. As examples, this may be beneficial, for example, to applications that have analog electrical voltages as inputs, such as sensors, image processing circuitry, I/O devices, and the like.

Figure 5:
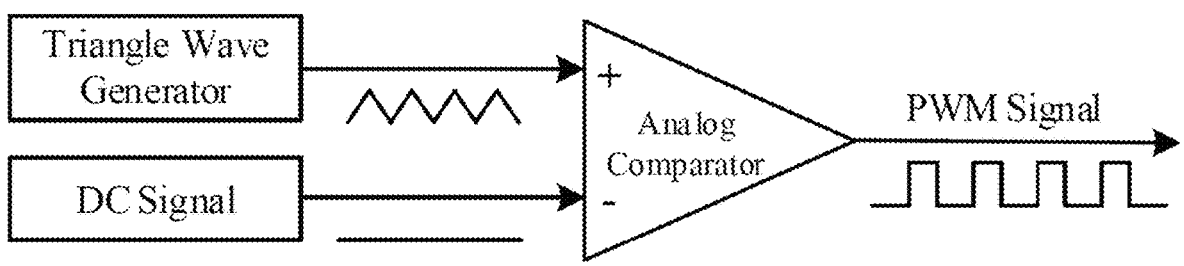
FIGS. 5 and 6A illustrate PWM generators, in some examples of this disclosure.

As described herein, electronic systems, such as existing analog inputs or onboard microcontrollers, can be employed to generate PWM signals for input to stochastic processing circuitry. In accordance with this disclosure, one way to generate a PWM signal is to feed a sawtooth wave into the first input of an analog comparator and a control voltage into the second. The frequency of the sawtooth waveform determines the sampling rate of the signal. Thus, by changing the frequency of this wave, one can adjust the frequency of the generated PWM signal. FIG. 5 shows one design for an analog PWM generator. The duty cycle of the PWM signal is set by changing the DC level of the input signal. The higher the DC level is, the wider the PWM pulses. The range of the DC signal varies between the minimum and maximum voltages of the triangle wave. For example, if the DC signal is adjusted to have a level exactly half-way between the minimum and maximum, the circuit will generate a PWM signal with a duty cycle of 50%. This duty cycle will correspond to an input value of 0.5 in the unipolar and 0.0 in the bipolar representation.

Figure 6A:
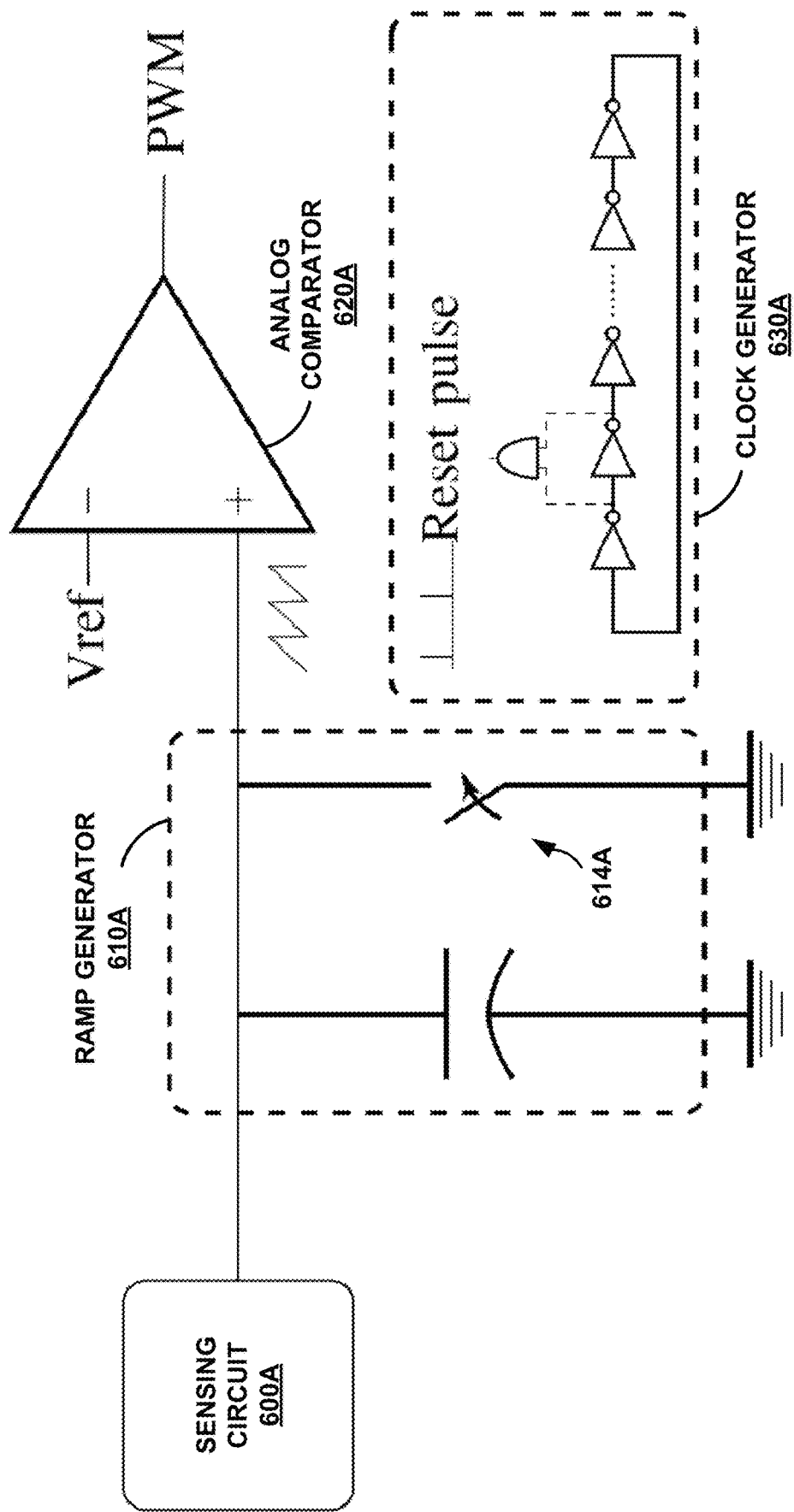

FIG. 6A shows an example design of a low-cost PWM generator, consisting of a ramp generator 610A, a clock signal generator 630A, and an analog comparator 620A. The input is a current coming from sensing circuit 600A that controls the duty cycle of the PWM signal. Sensing circuit 600A may output an analog sense signal (e.g., an electrical current) indicative of a sensed input, such as light intensity. Ramp generator 610A may be configured to receive the analog sense signal from sensing circuit 600A and output a ramp signal to analog comparator 620A. FIG. 6A depicts the ramp signal as a sawtooth signal that may ramp up to an output voltage that is set as a function of the analog sense signal. Ramp generator 610A may set the output voltage by controlling switch 614A.

Analog comparator 620A has a first input, shown as a non-inverting input in FIG. 6A, that receives the ramp signal from ramp generator 610A. Analog comparator 620A has a second input, shown as an inverting input in FIG. 6A, that receives a reference voltage (Vref). Analog comparator 620A may be configured to output a PWM signal based on a comparison of the ramp signal and the reference signal. The output PWM signal is an example of one of PWM signals 16A-16N. Clock generator 630A provides the required Reset signal which determines the frequency of the PWM signal. Ring oscillators consisting of an odd number of inverter gates can be used as clock generator 630A. The frequency of the Reset clock signal can be adjusted by either changing the supply voltage or changing the number of inverters in the oscillator. The Reset clock signal resets analog comparator 620A and controls a period for the PWM signal. In the 45-nm technology, a ring of approximately 89 inverter gates can generate a local clock with a period of 1 ns with a supply voltage of 1 V.

TABLE I

Area-power comparison of different SNGs.

| SNGs | Unit | Area (µm²) | Power @ 1-3 GHz (µW) |
|---|---|---|---|
| Conventional SNG (with 8-bit LFSR) | LFSR + Comparator | 248 | 335-1,013 |
|  | ADC | >400,000 | >10,000 |
| Special SNG for vision chips | LFSR | 167 | 298-892 |
|  | DAC + Comparator | equivalent to an ADC | |
| PWM generator (1-3 GHz freq.) | Comparator | 20-58 | 65-192 |
|  | Ramp Generator | 10-32 | 11-29 |
|  | Clock Generator | 124-37 | ~175 |

Table I shows an area-power comparison of the proposed PWM generator shown in FIG. 6A with prior methods for SNGs: the LFSR-based method and the method proposed for vision chips. The results are for 45-nm technology. The input signals are analog voltages or currents coming from sensing circuit 600A. Analog-to-digital convertors (ADCs) are used to obtain a digital representation for the LFSR-based method. The special SNG proposed for vision chips resembles an ADC and may be roughly as expensive as a SAR ADC. The synthesis results in Table I demonstrate that the techniques of this disclosure, based on PWM generators, have much lower area and power costs than prior methods in cases where the inputs are in analog voltage or current form. Accordingly, the approach including PWM generators is a good fit for real-time image processing circuits, such as those in vision chips. Vision chips have image sensors that convert the perceived light intensity to an analog voltage or current.

In prior methods, a counter was used to convert stochastic streams back into real values in the digital domain. However, when PWM signals are used, a simple voltage integrator can be used to average the signal and so measure the fraction of the time that the signal is high. For example, for a PWM signal with a period of T, duty cycle of D, $y_{high}=1$ V, and $y_{low}=0$ V, a voltage integrator gives the average value of the first period of the signal as shown in Equation (2).

$$\bar{y} = \frac{1}{T}\int_0^T f(t)dt = \frac{1}{T}\int_0^{(1-D)T} y_{low} f(t)dt + \frac{1}{T}\int_{(1-D)T}^T y_{high} dt = \qquad (2)$$
$$\frac{1}{T}(T \cdot (1-D) \cdot y_{low} + T \cdot D \cdot y_{high}) = D$$

Other stochastic circuits may receive random bit streams as inputs. Sensing circuits, such as image sensors, convert the sensed data (for example, light intensity) to an analog voltage or current. The voltages or currents may then be converted to digital form, as binary radix, with costly ADCs. Finally, stochastic bitstream generators, consisting of random number generators (that is, linear-feedback shift registers) and comparators, are used to convert the data from binary radix format to stochastic bitstreams.

A sensor may produce a time-encoded output, which in turn becomes an input to a stochastic computing circuit. The stochastic computing circuit may be configured to work directly with these analog signals instead of converting the input data into digital bitstreams. This approach may result in a significant saving in energy at the front end. Another compelling advantage is the improvement in the processing time. By using time-encoded signals, the total processing time can be reduced to a time equal to only one clock cycle. The precision of the computation may depend on the precision of the PWM signal in time, rather than the length of the bitstream.

Figure 6B:
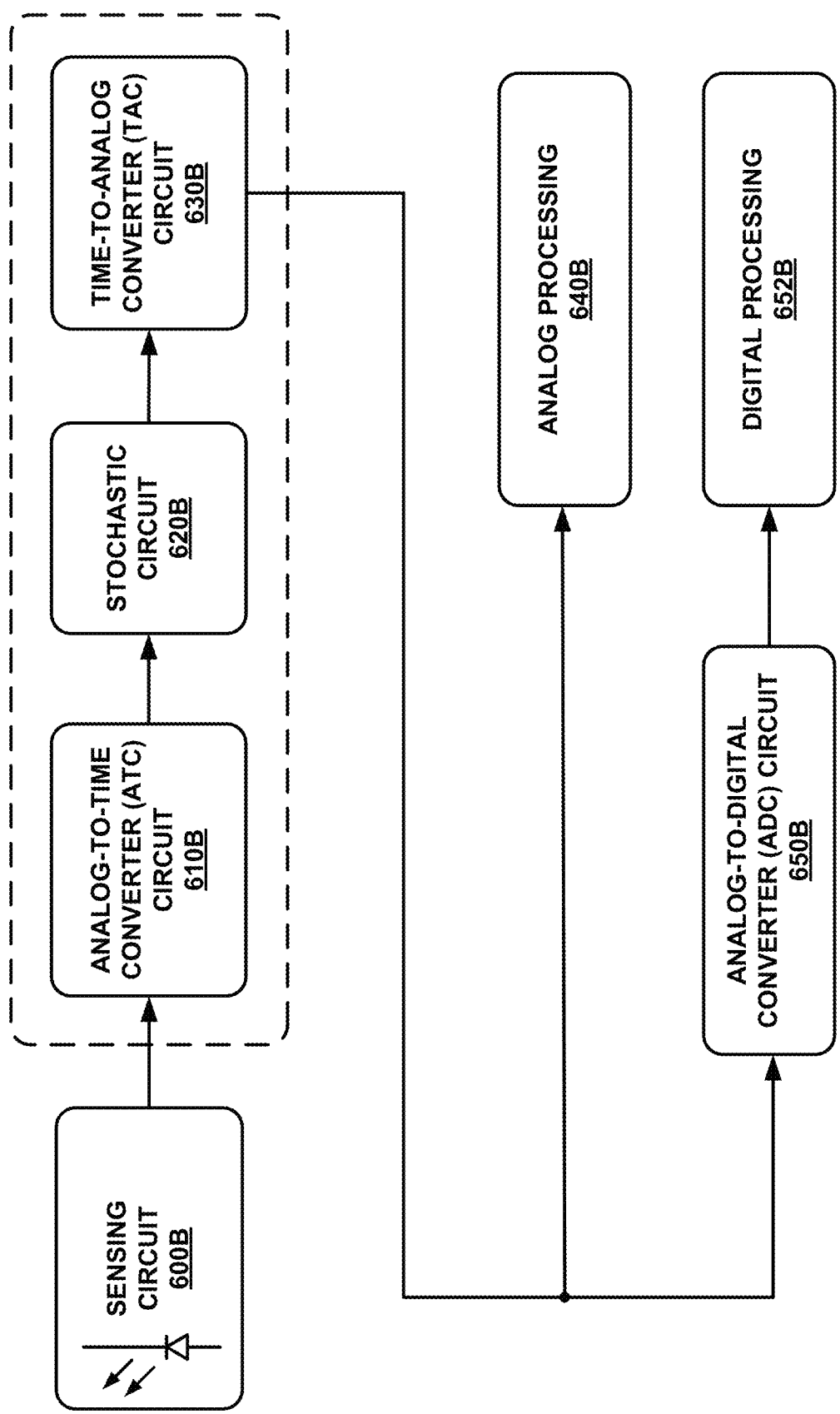
FIG. 6B illustrates time-based computing with stochastic constructs, in some examples of this disclosure.

FIG. 6B illustrates time-based computing with stochastic constructs, in some examples of this disclosure. FIG. 6B shows the flow of computing on time-encoding signals. Analog-to-time converter (ATC) circuit 610B converts the sensed data to a time-encoded pulse signal. The converted signal is processed using stochastic circuit 620B, and the output is converted back to a desired analog format using time-to-analog converter (TAC) circuit 630B.

Assuming that the output of sensing circuit 600B is in voltage or current form, ATC circuit 610B (i.e., a PWM signal generator) may convert the sensed data to a time-encoded pulse signal. ATC circuit 610B may be very low cost, both in terms of hardware area and energy consumption (approximately 30 µm² and 0.08 pJ, respectively, for 1 GHz frequency, when ATC circuit 610B is supplied with an external clock source). The converted signal is processed using the same circuit constructs as are used in stochastic computing. TAC circuit 630B converts the output back to a desired analog format. TAC circuit 630B may be simply a voltage integrator circuit.

The implementation cost of ATC circuit 610B, which can include an analog comparator, a ramp generator, and a clock generator, may be a function of the frequency of ATC circuit 610B. Increasing the frequency (and thus decreasing the period of the PWM signal) of ATC circuit 610B increases the implementation cost of the comparator and ramp generator, but lowers the cost of the clock generator (for example, a lower number of inverters in a ring oscillator leads to a higher oscillation frequency). For frequency ranges of lower than 3 GHz, the clock generator may have the dominant cost and so increasing the frequency lowers the total implementation cost of ATC circuit 610B. However, increasing the frequency may decrease the effective number of bit (ENOB) of time-based representation, which might then decrease the accuracy of the computation. For comparable accuracy levels, the synthesis results in other circuits may show a forty percent hardware cost reduction when replacing the conventional stochastic number generator with ATCs in image-processing applications.

In the SC representation, a single AND (XNOR) gate performs multiplication if the unipolar (bipolar) format is used. The multiplication operation presumes that the inputs are independent, uncorrelated streams. Connecting two PWM signals with the same duty cycle and the same frequency to the inputs of an AND gate will evidently not work. This arrangement produces an output signal equal to the two inputs, not the square of the value as required. However, as described herein, PWM signals can be used if the PWM signals have different frequencies (recall that values are represented by the duty cycle of PWM signals, not their frequency). Instead of continuous-valued time signals, PWM signals may be represented as bit streams. For instance, assume an input value $X=3/5$ (so a signal with duty cycle of 60%) is represented by the bit stream 11100, and an input $Y=1/2$ (so a duty cycle of 50%) is represented by the bit stream 1100. Note that the stream for X has length of five while that for Y has length of four. An AND gate may perform a multiplication operation on X and Y. The bit streams may run for 20 clock cycles, corresponding to four repetitions of X and five repetitions of Y. Taking the bit-wise AND of the streams results in the following bit stream.

$$\begin{array}{rl} X = & 11100111001110011100 \\ Y = & 11001100110011001100 \\ \hline X \cdot Y = & 11000100000010001100 \end{array}$$

The output includes six ones out of twenty bits in the output, the expected value, since $3/5 \times 1/2 = 6/20$. The results of this sort of multiplication operation is always correct if stream lengths are chosen that are relatively prime and the bit streams are run up to the common multiple. The correct result occurs because when the lengths of the inputs are relatively prime the difference between the lengths results in a new phase between the signals in each repetition until they get to the common multiple. Intuitively, a new initial phase in each repetition provides the independence required in performing stochastic operations. Expanding this observation to analog PWM signals, a good rule of thumb for multiplication of stochastic numbers represented by PWM signals is that the periods of the input signals must not be multiples of one another. It may be desirable to have numbers that have the minimum number of common divisors. For example, 20 nanoseconds and 13 nanoseconds would be good choices for two periods, whereas 20 nanoseconds and 10 nanoseconds would not. To verify, multiplication was simulated on a thousand sets of random input values represented by ideal PWM signals. The period of the first PWM signal was fixed at 20 nanoseconds while varying the period of the second from 1 nanosecond to 20 nanoseconds in increments of one hundred picoseconds. For each pair of periods, the randomly generated sets were converted into corresponding PWM signals and then performed multiplication for one thousand nanoseconds. The accuracy of the results was verified by calculating the difference between the expected value and the measured output value for all sets. To convert the output signals into deterministic real values, the fraction of the time that the output is high was measured and the time duration of the high output is divided by the total time. The average error rates for multiplication for different pairs of periods are shown in FIG. 7.

Figure 7:
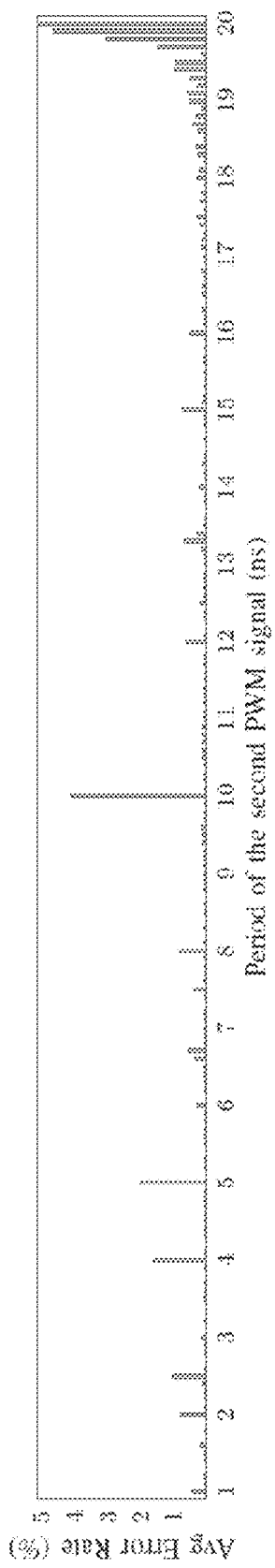
FIG. 7 is a graph of average error rates as a function of the time period of a second input PWM signal, where the time period of the first input PWM signal is twenty nanoseconds, in some examples of this disclosure.

As can be seen in FIG. 7, with the period of the first PWM input signal fixed at 20 nanoseconds, choosing 1 nanosecond, 2 nanoseconds, 2.5 nanoseconds, 4 nanoseconds, 5 nanoseconds, 8 nanoseconds, 10 nanoseconds, 12 nanoseconds, 15 nanoseconds, 16 nanoseconds, or values very close to 20 nanoseconds as the period of the second PWM input signal produces poor results. This can be attributed to an "aliasing" affect that occurs with periods that are multiples of one another. Eliminating these choices, the measured average error rate for other values was less than 0.5%. Note that these results could be extended to any other range of periods. For example, if 20 nanoseconds and 13 nanoseconds is a good pair, with an error rate of only 0.04% for multiplication, periods of 2 nanoseconds and 1.3 nanoseconds, or 10 nanoseconds and 6.5 nanoseconds would work equally well. Stochastic multiplication of numbers represented by PWM signals may produce highly accurate results if relatively prime periods are selected for the signals.

Applying these concepts to FIG. 2, PWM generation circuitry 12A and 12B may be configured to generate PWM signals 16A and 16B with different periods. Having different periods for PWM signals 16A and 16B may increase the accuracy of the computational operations performed by stochastic processing units 10A and 10B. PWM generation circuitry 12A and 12B may be configured to select periods for PWM signals 16A and 16B that are relatively prime to further increase the accuracy of the computational operations. PWM generation circuitry 12A and 12B may select a time duration to repeatedly generate and output PWM signals 16A and 16B based on a least common multiple of the periods of PWM signals 16A and 16B. For example, for periods of two nanoseconds and three nanoseconds for PWM signals 16A and 16B, PWM generation circuitry 12A and 12B may select a total time period of six nanoseconds, which is the least common multiple of the two periods of PWM signals 16A and 16B.

Figure 8:
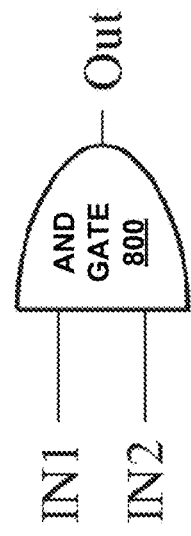
FIG. 8 illustrates multiplication of two PWM signals using an AND gate, in some examples of this disclosure.
Figure 8:
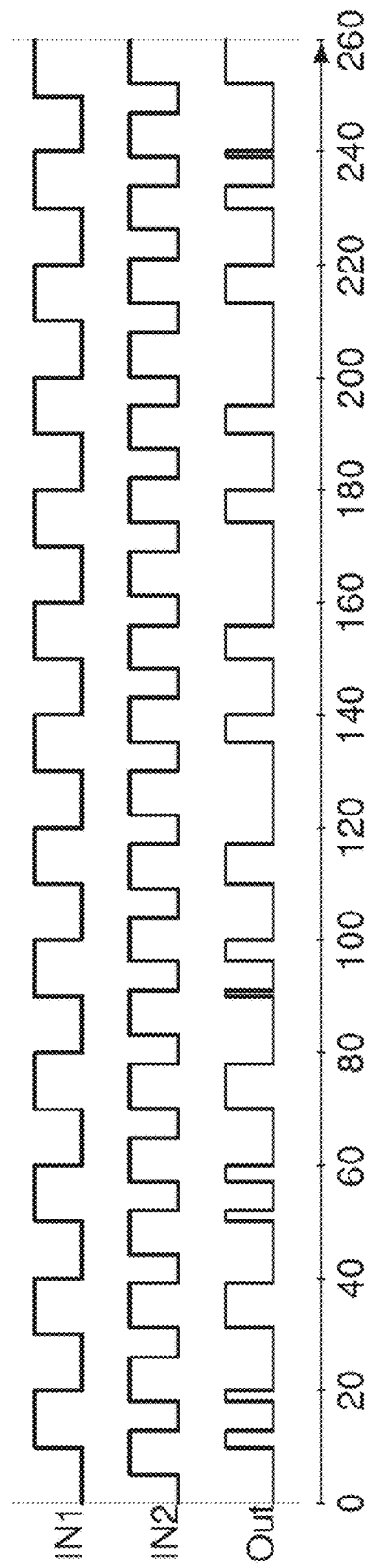

With relatively prime PWM signals as inputs of multiplication, the fraction of time that the output signal is high will converge to the expected value eventually. However, stochastic circuits may not be optimal with respect to energy efficiency if the operations run more than necessary. The question is: How many cycles of PWM signals are required to reach to a reasonable accuracy? FIG. 8 shows an example of multiplying two stochastic numbers, 0.5 and 0.6, represented using two PWM signals. AND gate 800 performs the multiplication operation. The period of the first PWM signal is 20 nanoseconds and that of the second is 13 nanoseconds. FIG. 8 shows that, after performing the operation for 260 nanoseconds, the fraction of the total time the output signal is high equals the value expected, when multiplying the two input values, namely three-tenths.

Figure 9:
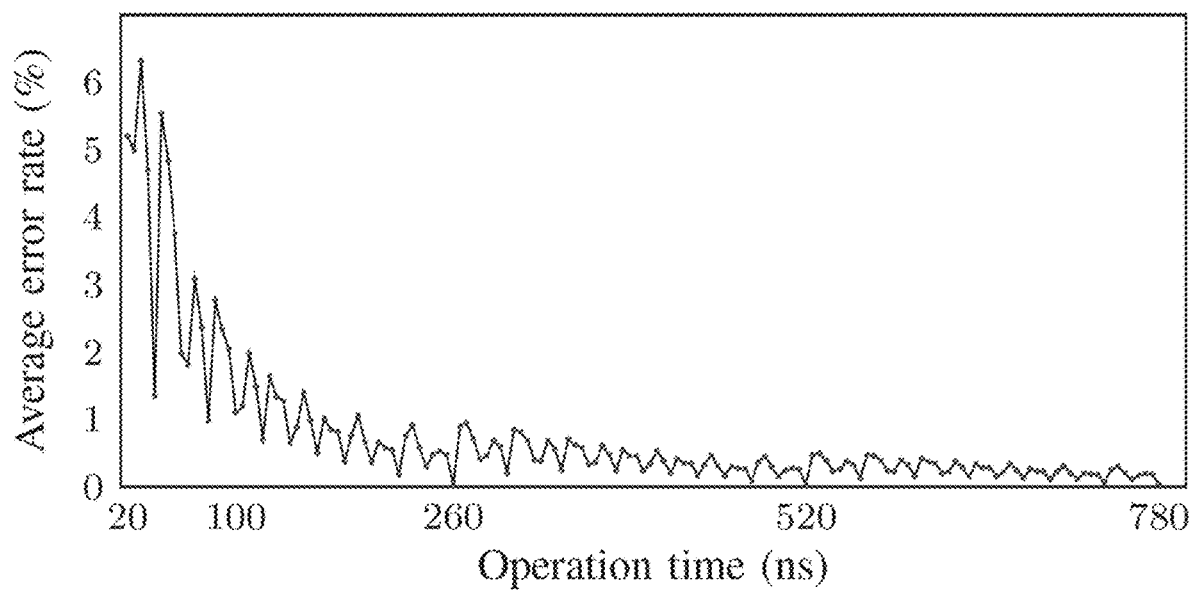
FIG. 9 is a graph of average error rate as a function of operation time, in some examples of this disclosure.

Expanding the example above to different operation times, FIG. 9 shows the average error rates of multiplying one thousand pairs of random numbers represented by PWM signals when a fixed period of 20 nanoseconds is selected for the first and a fixed period of 13 nanoseconds is chosen for the second. The operation time may be varied. As the figure shows, the output of multiplications converges to the expected value if the operations continue at least up to the least common multiple (LCM) of the periods of the input signals (here, 20 multiplied by 13 equals the LCM, which is 260 nanoseconds). The best possible accuracy is obtained when the operation is run for exactly the LCM (260 nanoseconds) or multiples of the LCM (for example, 520 nanoseconds and 780 nanoseconds). Running the operation longer than the LCM does not help the accuracy. This result is in contrast to other stochastic computing approaches where increasing the length of bit streams improves the quality of the results.

Consider the X·Y stream produced before. The LCM of the input streams was 4×5=20, and after exactly 20 cycles the expected output was produced. Continuing the operation for another 20 cycles produces exactly the same output with the same ratio of ones to the length of stream:

$$\begin{array}{rl} X = & 11100111001110011100\ 11100111001110011100 \\ Y = & 11001100110011001100\ 11001100110011001100 \\ \hline X \cdot Y = & 11000100000010001100\ 11000100000010001100 \end{array}$$

Thus, the output has a period of 20 cycles. A similar result is observed when ANDing continuous PWM signals. The output has a period of the LCM. The signal produced from the first LCM to the second LCM is exactly the same as the signal produced from time equals zero to the first LCM. Thus, the best accuracy when multiplying numbers represented by PWM signals is obtained when running the operation for the LCM or multiples of the LCM of the period of the inputs.

In example implementations, the PWM generation logic may select relatively prime periods for the input signals, and the multiplication operation may be run for the LCM of the periods. Considering available sets of relatively prime periods, each with a different LCM, the best set of periods to reach to a desired accuracy is an important selection. For example, (17 nanoseconds, 3 nanoseconds) and (17 nanoseconds, 7 nanoseconds) are two possible sets of periods to generate the PWM input signals for a multiplication operation. The first set has an LCM of 91 nanoseconds while the second set has an LCM of 119 nanoseconds, but one of these two sets may be a better choice. Moreover, sets of periods with equal LCM may have different error rate. For example, both (18 nanoseconds, 5 nanoseconds) and (10 nanoseconds, 9 nanoseconds) have an LCM of 90 nanoseconds, but the error rates for the two sets of periods may not be the same.

Figure 10:
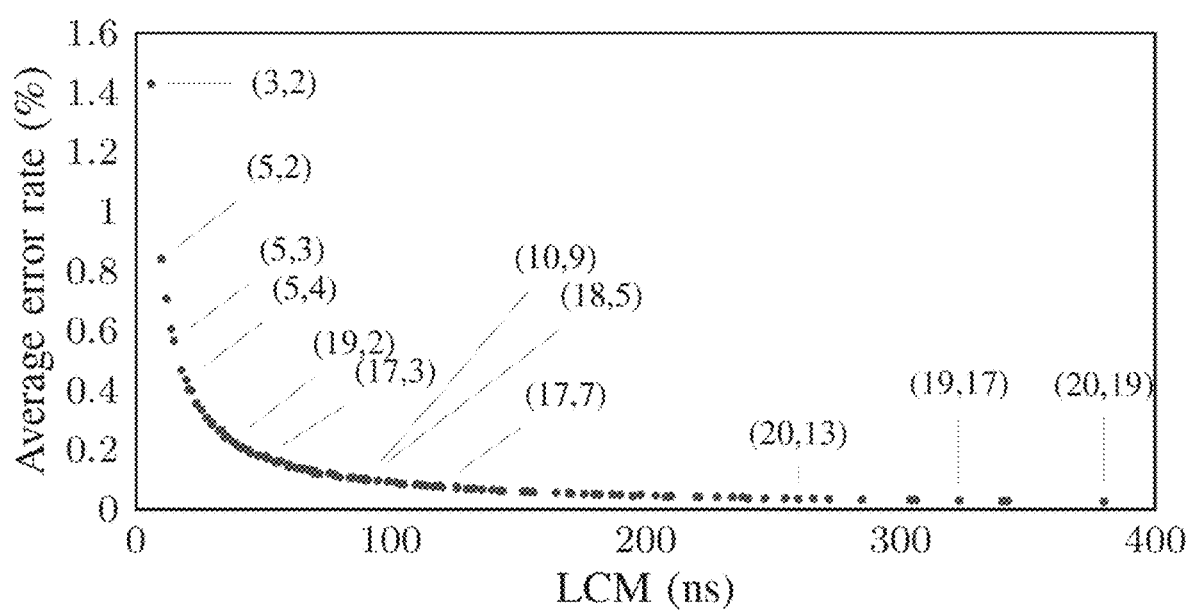
FIG. 10 is a graph of average error rate as a function of least common multiple of two time periods, in some examples of this disclosure.

FIG. 10 shows the average error rates of multiplying one thousand pairs of random numbers represented by PWM signals when different sets of relatively prime periods are selected as the periods of the input signals and the operations are run for the LCM of the periods. Each set of periods has a different LCM. As depicted in FIG. 10, the larger the LCM, the lower the average error rate. Based on this observation, from the point of view of accuracy, (17 nanoseconds, 7 nanoseconds) with 0.07% error rate is a better choice than (17 nanoseconds, 3 nanoseconds) with 0.17% error rate. While generating PWM signals with longer periods and so larger LCMs gives more accurate results, signals with longer periods require a longer operation time. Thus, if a set of periods with a smaller LCM can satisfy the accuracy requirements, the set of signals with a smaller LCM might be the better choice.

Another case is when two sets of periods have different periods but the same LCM. Consider (10 nanoseconds, 9 nanoseconds) and (18 nanoseconds, 5 nanoseconds). They both have LCM of 90 nanoseconds, but with different periods. Extrapolating from the results presented in FIG. 10, the first set has an error rate of 0.097% while the second has an error rate of 0.101%. Thus, the accuracy of the multiplication may be independent of the period of the inputs. The accuracy of the multiplication may instead be a direct function of the LCM of the periods of the input signals.

Thus, a larger LCM of the periods of the PWM input signals may increase the accuracy when performing multiplication.

Although this disclosure has analyzed multiplication of stochastic numbers in the unipolar encoding, the conclusions are also applicable to the bipolar format. The AND gate is replaced by an XNOR gate in multiplication of PWM signals in bipolar format while the input signals should still have relatively prime periods and the operation continues for LCM periods.

For scaled addition and subtraction, stochastic values are restricted to the interval [0,1] (in the unipolar case) or the interval [−1,1] (in the bipolar case). Addition or subtraction cannot be performed directly, since the result might lie outside these intervals. However, one can perform scaled addition and subtraction. These operations can be performed with a multiplexer (MUX). The performance of a MUX as a stochastic scaled adder and/or subtractor is insensitive to the correlation between its inputs. This result is because only one input is connected to the output at a time. Thus, highly overlapped inputs like PWM signals with the same frequency can be connected to the inputs of a MUX. The important point when performing scaled addition and subtraction with a MUX on PWM signals is that the period of the select signal should be relatively prime to the period of the input signals. For example, five nanoseconds, five nanoseconds, and four nanoseconds is a good set of numbers for the period of the first, the second, and the select input signals, respectively.

Figure 11:
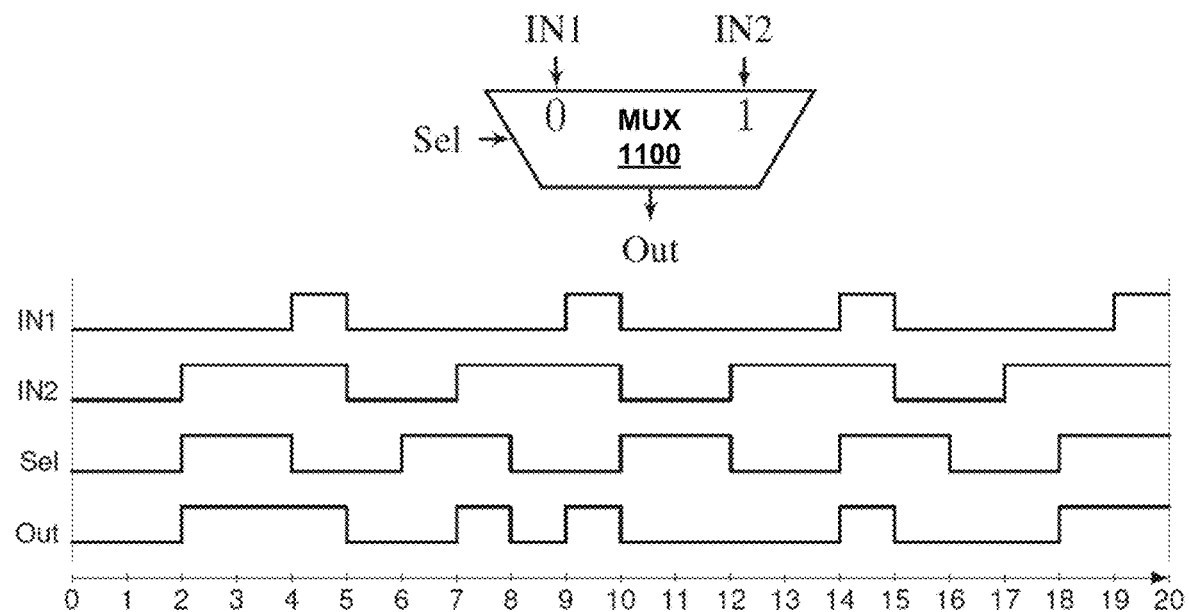
FIG. 11 illustrates scaled addition of two PWM signals using a multiplexer (MUX), in some examples of this disclosure.

FIG. 11 shows an example of scaled addition on two stochastic numbers, 0.2 and 0.6, represented by two PWM signals (both have periods of five nanoseconds). A PWM signal with duty cycle of 50% and period of four nanoseconds is connected to the select input of MUX 1100. As shown, after performing the operation for 20 nanoseconds, the fraction of the total time the output signal is high equals the expected value, 0.4. The same proposition for the multiplication operation also exists for scaled addition: the scaled addition/subtraction operation should be run for the LCM or multiples of the LCM of the period of the input signals and that of the select signal to produce the correct output. Choosing different periods for the main inputs of MUX 1100 results in a larger LCM and so longer operation time. Furthermore, generating inputs with different periods may include extra clock generator circuitry. So, it may be efficient to generate signals for the main inputs of MUX 1100 having the same period.

A unique property of MUX-based operations is that large LCMs are not necessarily required to produce accurate results. Similar to the multiplication operation, selecting relatively prime periods with a large LCM guarantees the accuracy of the results for the scaled addition/subtraction. However, it is possible for the stochastic MUX-based operations to produce accurate results even with inputs with very small periods.

Figure 12:
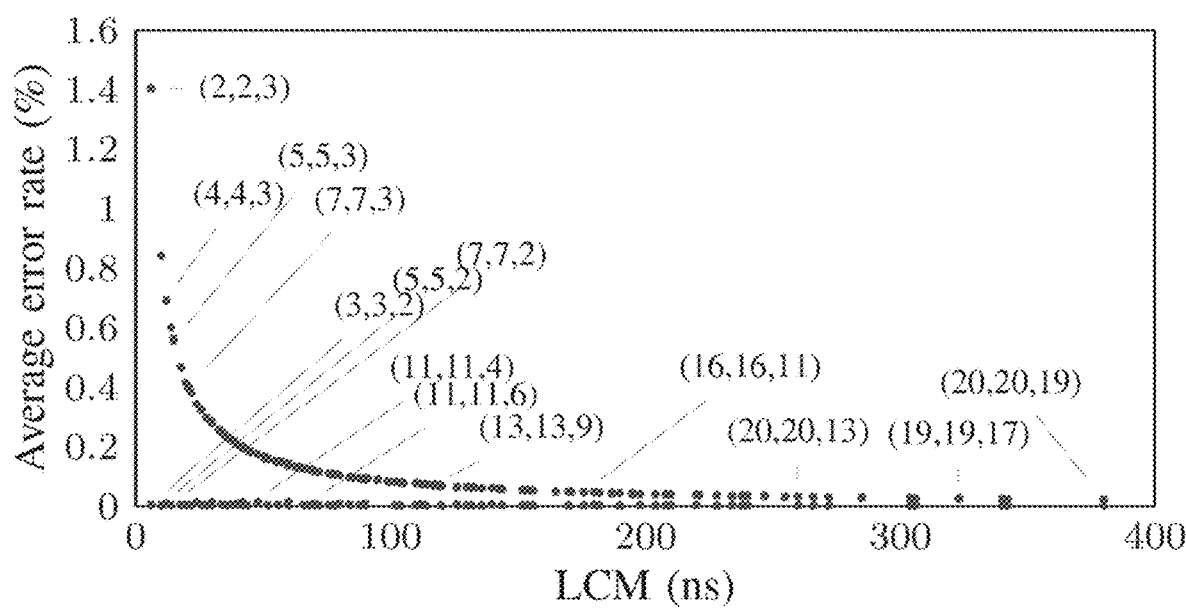
FIG. 12 is a graph of average error rate as a function of least common multiple of three time periods, in some examples of this disclosure.

FIG. 12 shows the average error rate of performing scaled addition when PWM signals with relatively prime periods are connected to the main and select inputs of the MUX. Each point in the figure represents the accuracy and the LCM corresponding to one set of periods. The first and the second numbers in each set are the period of the main PWM inputs and the third number is the period of the select input. As the results show, when the period of the PWM select signal is an "even" value (two nanoseconds, four nanoseconds, and so on) choosing "odd" periods as the period of the main PWM inputs result in highly accurate outputs. When choosing an "even" period for the inputs and an "odd" period for the select signal, a large LCM is needed to produce accurate results.

Figure 13:
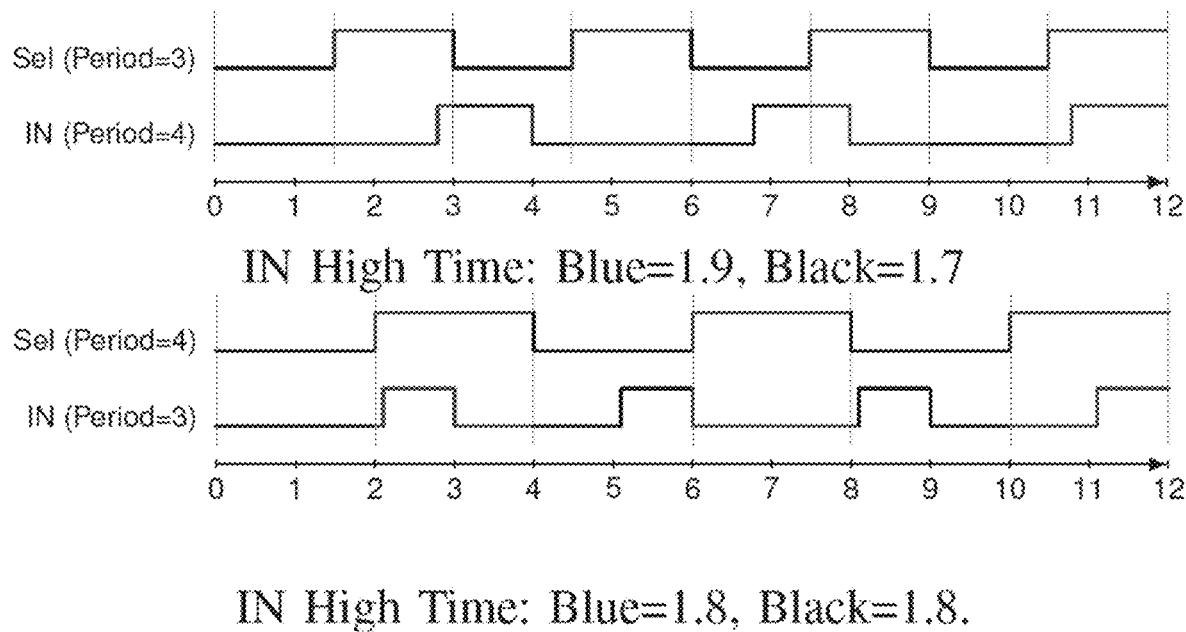
FIG. 13 illustrates two example input PWM signals for scaled addition by a multiplexer, in some examples of this disclosure.

One reason for this result is shown in FIG. 13. A select signal with an "even" period perfectly splits an input with an "odd" period in two periodic parts with the same time at high. Thus, it does not matter to which input of the MUX the input signal is connected. However, in the case of an "odd" period for the select signal, connecting the input signal to different inputs of the MUX selects different parts of the input signal with different times at high. This result motivates the conclusion that optimal choices for MUX-based operations are those with "even" value for the period of the select input and an "odd" value for the period of the main inputs. The operation should run for the LCM of the periods.

Three properties are exclusive to the operations with independent time-encoded inputs. The first property of independent time-encoded inputs is that each independent input has a frequency inharmonic to the frequencies of other independent inputs. Therefore, each independent input may use a separate clock source. The second property is that increasing the number of independent inputs increases the operation time. The period of the output signal and so the operation time equals the product of the periods (1/frequency) of the independent time-encoded inputs. Thus, by increasing the number of independent inputs, the circuit may run for a longer time to produce accurate results.

The third property is that the accuracy of operations is inversely proportional to the frequency of input signals. Although increasing the frequency lowers the operation time, it decreases the ENOB in representing the input values and so the accuracy in the computations. Compared to conventional bitstream-based stochastic computing, time-encoding the inputs can significantly improve the processing time and hardware area and power cost. Time-encoding the inputs can also significantly improve the energy consumption of operations that require independent inputs.

Correlation between the inputs of a stochastic circuit can sometimes change the functionality of a circuit, which might result in a more desirable operation. An XOR gate with independent inputs performs the function $z=x_1\times(1-x_2)+x_2\times(1-x_1)$. However, when fed with correlated inputs where the two input streams have maximum overlap in their high bits, the circuit computes $|x_1-x_2|$. Consider $x_1$ equals 11101 and $x_2$ equals 10001, two five-bit long correlated stochastic streams representing 4/5 and 2/5. Connecting these streams to the inputs of an XOR gate produces Y equals 01100, the expected value from performing absolute valued subtraction. This time the output stream has the same number of bits as the input streams.

Figure 14A:
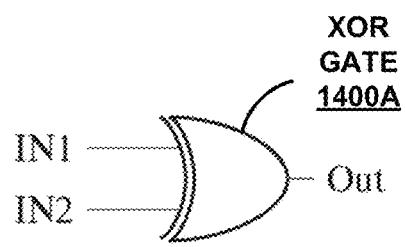
FIG. 14A illustrates absolute-value subtraction of two PWM signals using an XOR gate, in some examples of this disclosure.
Figure 14A:
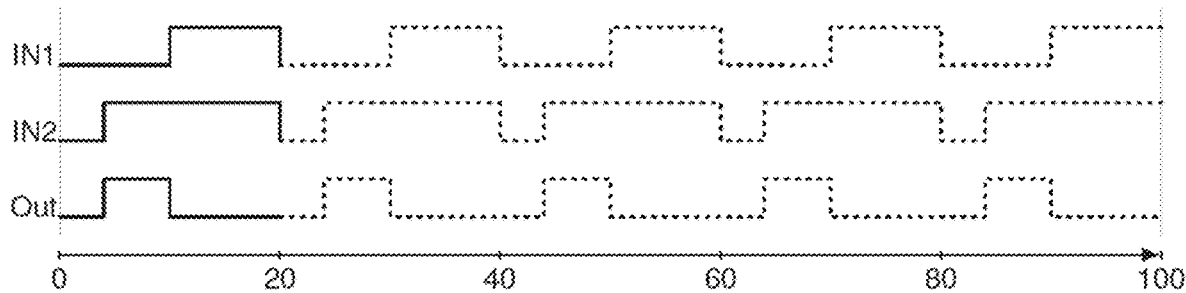
Figure 14B:
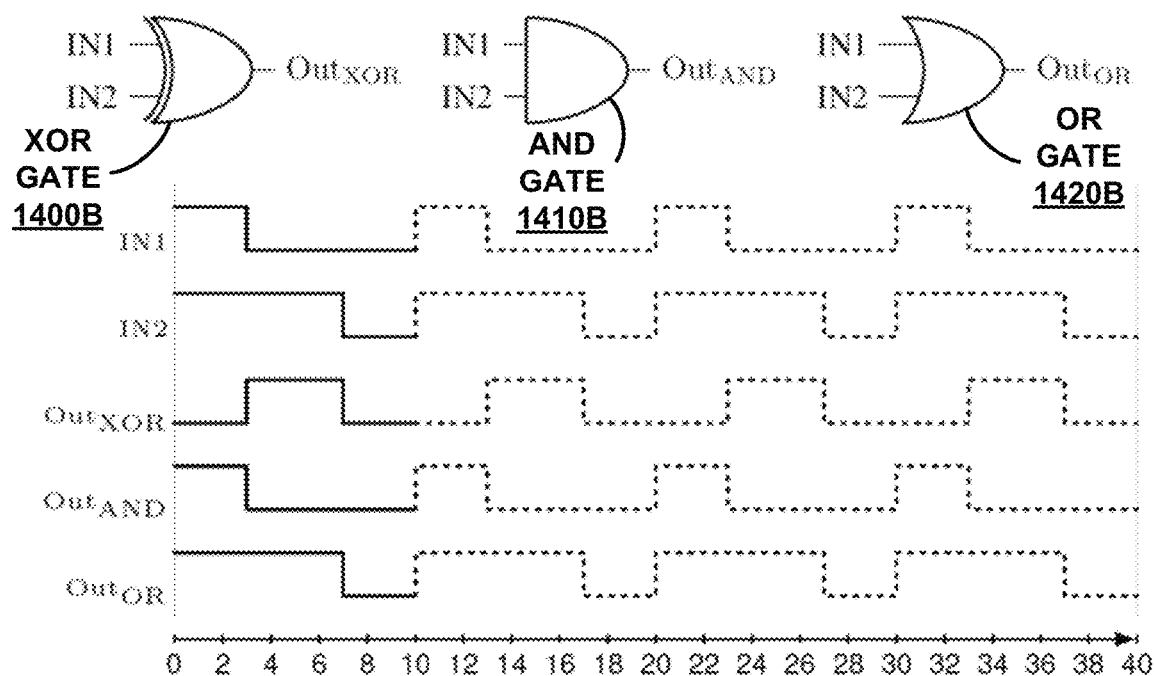
FIG. 14B illustrates absolute-value subtraction, minimum, and maximum operations on two synchronized PWM signals, in some examples of this disclosure.
Figure 14C:
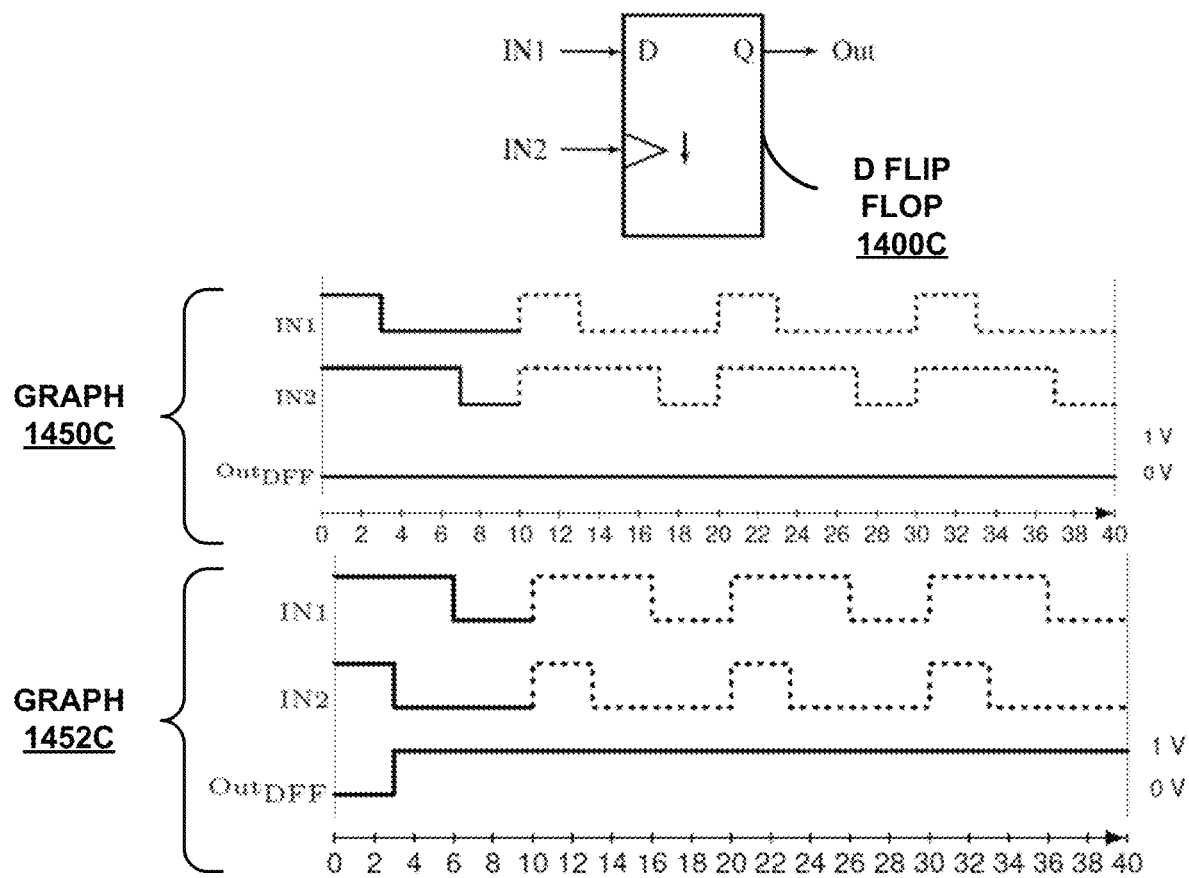
FIG. 14C illustrates a D-type flip-flop comparing stochastic numbers represented by synchronized PWM signals, in some examples of this disclosure.

When working with PWM signals, high correlation or maximum overlap is provided by choosing the same frequency for the input signals, and having maximum overlap between the high parts of the signals. Thus, two PWM signals that have the same period, with the high part in each one located at the start or end of each period, are called correlated (or synchronized) signals. FIG. 14A shows an example of performing absolute value subtraction on two synchronized PWM signals. XOR gate 1400A in FIG. 14A performs the absolute value subtraction operation on two input PWM signals. FIGS. 14A-14C illustrate examples of stochastic operations with correlated time-encoded inputs. As the figures shows, the correct output with the highest possible accuracy is ready right after performing the operation for only one period of the PWM input signals. For operations like absolute value subtraction that work only with correlated inputs (synchronized PWM signals), the period of the output signal and so the operation time equals the period of the input signals.

This conclusion introduces an important advantage of working on the synchronized PWM signals, which is eliminating the requirement of running the operation for several repetitions of the input signals to obtain an accurate output signal. The important point, however, is that there may be a limitation in using such operations that includes highly correlated inputs. Providing synchronization (maximum high part overlap between the input signals) may be difficult for the second (or higher) level of the circuit where the signals are the output of a previous level. Nonetheless, performing these operations can still be advantageous at the first level of circuits.

FIG. 14B illustrates absolute-value subtraction, minimum, and maximum operations on two synchronized PWM signals, in some examples of this disclosure. The PWM signal labeled "IN1" represents a numerical value of 0.3, and the PWM signal labeled "IN2" represents a numerical value of 0.7. Both input PWM signals have a period of ten nanoseconds.

In the example of FIG. 8, AND gate 800 is configured to receive independent inputs and operates as a multiplier. However, with highly correlated inputs, AND gate 1410B can give the minimum of the two input stochastic streams. OR gate 1420B supplied with highly correlated streams can give the maximum of the two stochastic streams. Thus, a basic sorting unit can be constructed with only AND gate 1410B and OR gate 1420B. When gates 1410B and 1420B receive two correlated inputs, AND gate 1410B produces the smaller of the two values on one output line, and OR gate 1420B produces the greater of the two values on the other output line. This low-cost implementation of sorting can save orders of magnitude in hardware resources and power when compared to the costs of a conventional binary implementation. These stochastic circuits are important for applications such as the median filtering noise-reduction algorithm.

FIG. 14C illustrates a D-type flip-flop 1400C comparing stochastic numbers represented by synchronized PWM signals, in some examples of this disclosure. In graph 1450C, the PWM signal labeled "IN1" is less than the PWM signal labeled "IN2," and thus the output signal "Out" equals zero. The falling edge of the PWM signal representing IN2 causes flip-flop 1400C to sample a low-level signal of IN1, and thus logical-zero is produced at the output. In graph 1452C, the PWM signal labeled "IN1" is greater than the PWM signal labeled "IN2," and thus the output signal "Out" equals one. The falling edge of the PWM signal representing IN2 causes flip-flop 1400C to sample a high-level signal of IN1, and thus logical-one is produced at the output.

Comparison of stochastic numbers is another common operation in stochastic circuits. D-type flipflop 1400C may be configured to perform stochastic comparison operation. For correct functionality, the inputs of flip-flop 1400C must be correlated. For a digital representation, all ones in each stream must be placed together at the beginning of the stream. The first stochastic number should be connected to the D input, and the second one should be connected to the falling edge triggered clock input. The output of comparing two stochastic numbers, N1 and N2, will be zero if IN1 is less than IN2, and 1 otherwise.

There are three properties of operations with correlated time-encoded inputs. The first property is that the output of performing stochastic operations on synchronized PWM signals is ready after running the operation for only one period of the input signals. As shown in FIGS. 14A-14C, the fraction of time each output signal is high is the same in all periods of each output signal. In such cases, continuing the operation for additional periods (the dotted lines in FIGS. 14A-14C) does not change the value or, most importantly, the accuracy of the output.

The second property is that, in contrast to stochastic operations with independent inputs that needed time-encoded signals with inharmonic frequencies, the inputs of correlated operations must have the same frequency. Thus, only one source, generating one clock signal, suffices. Similar to operations that require independent inputs, by time-encoding of inputs, the processing time, area, and power cost, and consequently, energy consumption of operations that require highly correlated inputs can all be greatly reduced when compared to those of the conventional bit-stream based processing.

Figure 15A:
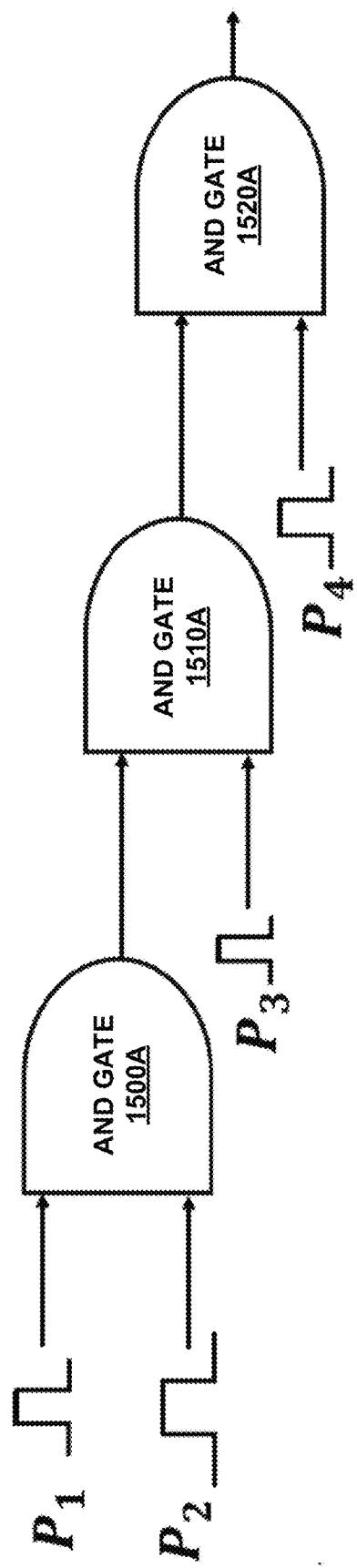
FIGS. 15A-15B illustrates examples of multi-level stochastic circuitry, in some examples of this disclosure.
Figure 15B:
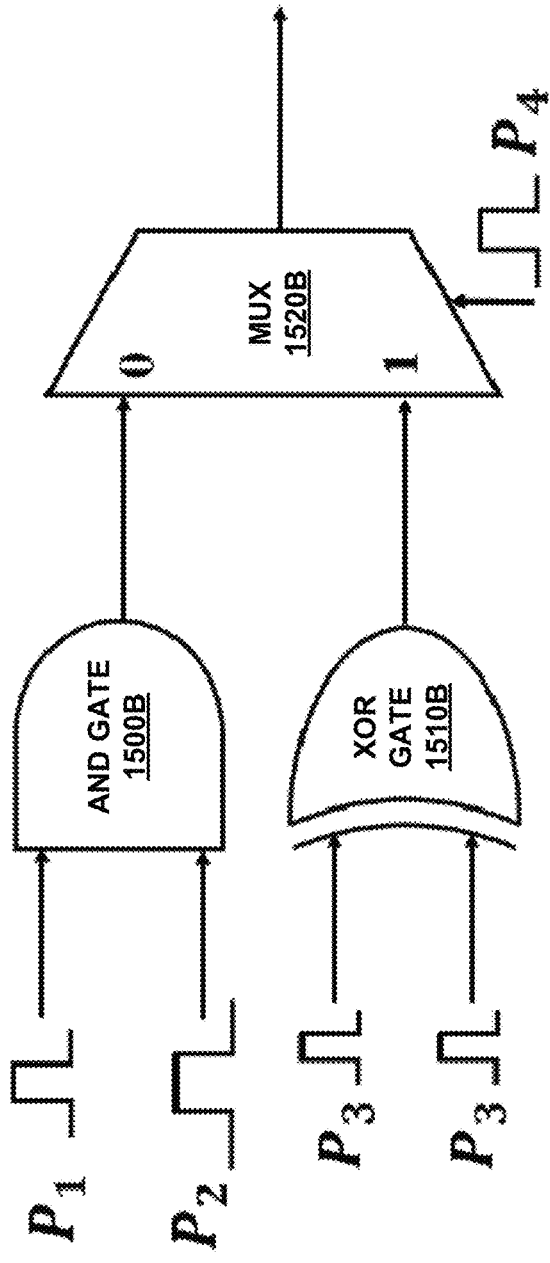

FIGS. 15A-15B show the functionality of multi-level stochastic logic when PWM signals are used as the inputs of the circuit. An interesting point in performing stochastic operations on PWM signals is that the output of each level can be used as the input of the next level even though the output is not a PWM signal. When connecting two PWM signals to a stochastic operator, the output is a conventional stochastic number whose value cannot be found by duty cycle but by probability of being in the "high" state. However, the main difference between such an output with a conventional random stochastic signal is that since the primary inputs were PWM signals the generated output is a periodic signal. This property allows the output of each level to be used as the input of the next level. Given the period of the output signal, the obtained signal and some new signals with relatively prime periods can be used in the following levels.

FIG. 15A presents an example of a three-level circuit multiplying four PWM signals with periods of P1, P2, P3, and P4. The periods of the inputs and the operation time can be chosen to lead to accurate outputs. Based on the conclusions herein, P1 and P2 should be relatively prime. AND gate 1500A should operate for i multiplied P1 multiplied P2 (1 is an integer greater than or equal to one). The output of AND gate 1500A is a signal with a period of P1 multiplied by P2. The accuracy of the output produced by AND gate 1510A depends on the output of AND gate 1500A and also on P3, the period of the third PWM signal. P3 should be relatively prime to the period of the signal generated at the output of AND gate 1500A, and so to P1 and P2. Finally, P4 should be relatively prime to P1, P2, and P3. The final output of AND gate 1520A has a period of P1 multiplied by P2 multiplied by P3 multiplied by P4, and so, the circuit may run for this amount of time to produce an accurate result.

Expanding the example of FIG. 15A to circuits multiplying NPWM signals with N relatively prime periods, the operation time is the LCM of all these periods. The important trade-off here is to select small or large periods for these signals. Small periods result in a small LCM, and so need a shorter operation time. Larger periods have larger LCMs and may include a longer running time. As shown in FIG. 10, the larger the LCM, the higher the accuracy of multiplication. Thus, selecting the period of the PWM signals for such circuits may depend on the accuracy and timing expectations.

The circuit presented in FIG. 15B incorporates all three sorts of basic operations. The output of AND gate 1500B has a period of P1 multiplied by P2 while the output of XOR gate 1510B has a period equal to the period of its inputs, or P3. The minimum operation time for this circuit is obtained when the inputs of MUX 1520B have the same periods (P1 multiplied by P2 equals P3). P3 must be an "odd" number while a small even value must be selected for P4. For this circuit the total operation time will be P3 multiplied by P4. In cases where P3 does not equal P1 multiplied by P2, the total operation time will be the LCM of the period of all inputs, or P1 multiplied by P2 multiplied by P3 multiplied by P4.

Figure 16A:
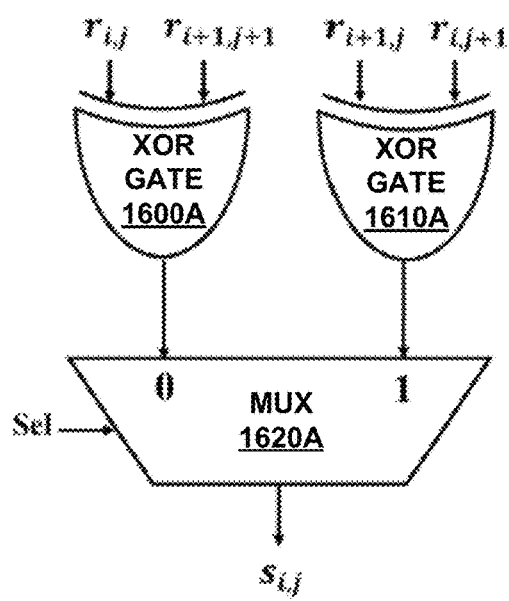
FIGS. 16A-16D illustrate examples of Robert's cross edge detection algorithms, in some examples of this disclosure.
Figure 16B:
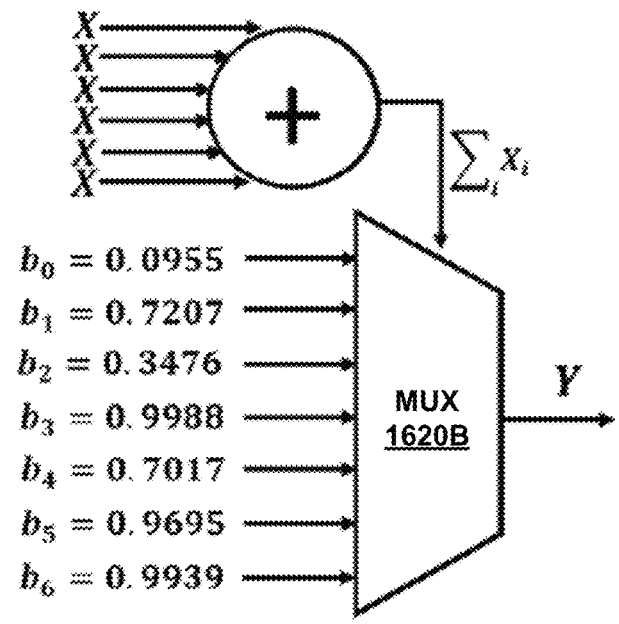
Figure 16C:
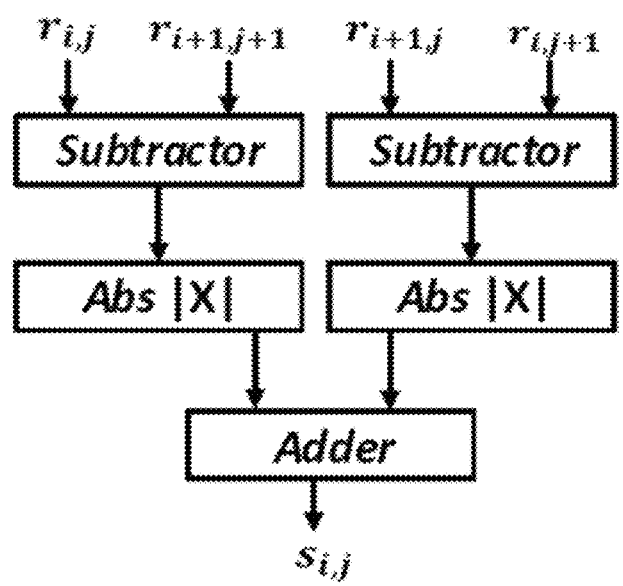
Figure 16D:
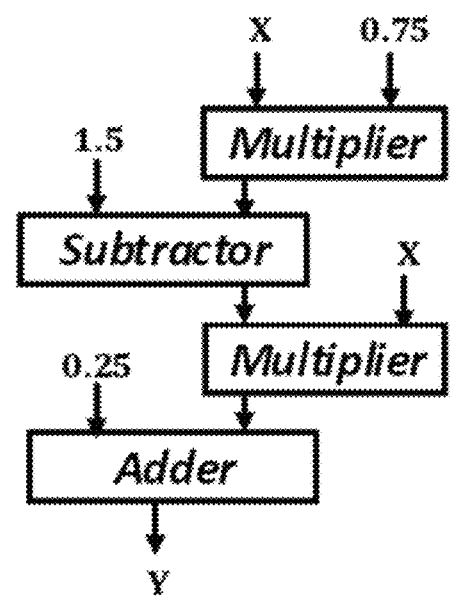
Figure 17:
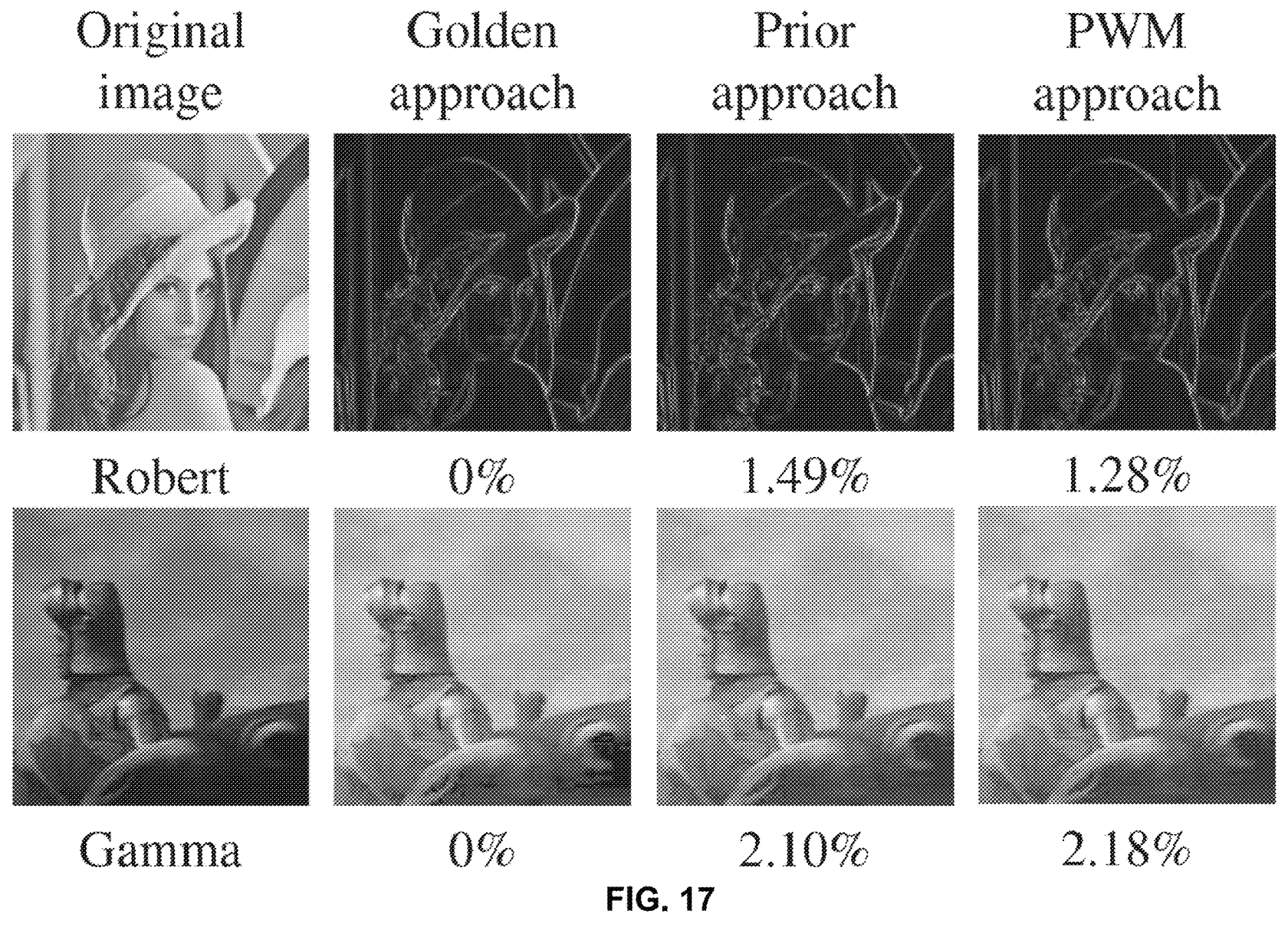

FIGS. 16A-16D illustrates hardware architecture of two well-known digital image processing algorithms: the Robert's cross edge detection algorithm and the Gamma correction function. The core stochastic computation circuit for Robert's cross algorithm and the core logic for the gamma correction algorithm are shown in FIGS. 16A-16B. The conventional stochastic approach includes pairing the core stochastic logic with input SNGs (LFSR plus comparator as shown in FIG. 3), and output counters to convert stochastic bit streams to binary numbers. The PWM approach includes pairing the core stochastic logic with PWM generators (FIG. 5) and a voltage integrator to generate the analog output. The conventional binary implementations of the selected algorithms are also shown in FIGS. 16C-16D. SPICE netlists were implemented for the stochastic circuits described above. Two 128 by 128 sample images (16384 pixels each) were selected for the simulations. Simulations were carried out using a 45-nm gate library in HSPICE. PWM generator proposed in FIG. 6A was implemented for converting input pixel values into the corresponding PWM signals. FIG. 17 shows the input sample images as well as the output of processing these images using a deterministic, software-based implementation of each algorithm. This approach is referred to as the "golden" approach, with a zero percent average error rate. The circuit operation was simulated on randomized stochastic streams in the "prior" approach. The conventional SNG described in FIG. 3 was used for converting input pixel intensities into stochastic bit streams. An 8-bit maximal period LFSR was used as the pseudo-random number generator. Bit streams 256 bits long were generated for each input value. The average output error rate was calculated for the output image produced by the implemented circuits as shown in Equation (3), where $S_{i,j}$ is the expected pixel value in the output image and $T_{i,j}$ is the pixel value produced using the circuits.

$$E = \frac{\sum_{i=1}^{128}\sum_{j=1}^{128}|T_{i,j}-S_{i,j}|}{255.(128\times 128)} \times 100 \qquad (3)$$

To compare the operation time of the PWM approach with the delay of the prior approach (conventional bitstream-based stochastic) and also that of the conventional binary approach, the Robert's cross and the gamma correction circuits were synthesized using a 45-nm gate library. The stochastic circuits had a critical path of 0.34 nanoseconds and 0.60 nanoseconds, respectively. The process of synthesizing the selected circuits with the proposed PWM approach will be described and then performance, area, and energy dissipation of the implemented circuits will be compared.

Each Robert's cross operator consists of a pair of two by two convolution kernels that process an image pixel based on its three neighbors as shown in Equation (4).

$$S_{i,j} = \frac{1}{2} \times (|r_{i,j}-r_{i+1,j+1}|+|r_{i,j+1}-r_{i+1,j}|) \qquad (4)$$

where $r_{i,j}$ is the value of the pixel at location (i, i) of the original input image and $S_{i,j}$ is the output value computed for the same location in the output image. FIG. 16A shows the stochastic implementation of the Robert's cross algorithm proposed by Alaghi, consisting of a MUX for the scaled addition and two XOR gates to perform the absolute value subtractions. This circuit is the core computation logic and is shared between the "prior" stochastic approach and PWM approach described in this disclosure.

In one method, to generate the circuit for the first approach, the core stochastic logic of FIG. 16A is paired with one LFSR and four comparators to generate the input streams feeding XOR gates 1600A and 1610A. Only one LFSR is used for the input lines of XOR gates 1600A and 1610A because the approach of Alaghi relies on correlated bit streams. Another LFSR and comparator is used to generate the select stream. When the input is given in analog voltage, coming from a sensing circuit, an ADC must be used to convert the analog input signal into digital form. The ADC unit is ignored in the comparisons. If the cost of the ADC were added, the PWM approach would have shown even larger gains compared to prior work. The output of the first approach circuit is fed to a counter to convert the bit stream to a binary number.

To synthesize the Robert's cross circuit with the PWM method, the core stochastic logic of FIG. 16A is paired with PWM generators that provide the input signals feeding XOR gates 1600A and 1610A, and the output of MUX 1620A is fed to a voltage integrator circuit. The first step in synthesizing the circuit in the PWM approach is frequency selection. Selecting appropriate frequencies is very important when using PWM signals as inputs of a stochastic circuit. The inputs to XOR gate 1600A or 1610A may be two synchronized PWM signals to compute the absolute value subtraction. Since MUX unit 1620A is also insensitive to the correlation between input signals, four synchronized PWM signals corresponding to four pixels of the image can be connected to the main inputs of the Robert's cross circuit.

It is desirable to appropriately select the frequency of the PWM signal connected to the select line of MUX 1620A. This select signal can be a clock signal which is a PWM signal with 50% duty cycle. The period of this signal must be relatively prime to the period of the main inputs of MUX 1620A. Since the period of the signal produced at the output of XOR gates 1600A and 1610A is the same as the period of their inputs, the period of the clock signal must be relatively prime to the period of the circuit's main inputs. Considering the critical path (0.34 nanoseconds) as the minimum allowed period of the PWM signals, 0.51 nanoseconds was used as the period of the main PWM input signals and 0.34 nanoseconds was used as the period of the select signal. These numbers are obtained by scaling (3 nanoseconds, 2 nanoseconds) down which is one of the best set of periods obtained in FIG. 10.

For the second step, the operation time is determined. The results of performing stochastic absolute value subtraction are ready after running the operation for only one period of the input PWM signals. For scaled addition/subtraction operations, the best operation time is the LCM of the periods of the select and input signals of MUX 1620A. Given that the periods were scaled (3 nanoseconds, 2 nanoseconds) down to (five hundred and ten picoseconds, three hundred and forty picoseconds), the best operation time is also obtained by scaling their LCM down by the same scaling factor. Thus, the best operation time for the synthesized Robert's cross circuit in the PWM approach is 1.02 nanoseconds.

For the third step, the clock signals are generated. Since the frequency of all four PWM inputs is the same, a clock generator with an oscillation period of 0.51 nanoseconds is enough to drive main PWM generators. A second clock signal with a period of 0.34 nanoseconds is also necessary for the select line of MUX 1620A. Thus, a total of two clock generators would be sufficient for generating the inputs of the Robert's cross circuit. Rings of 43 and 29 inverters can be used to generate the required clock signals.

Each image pixel is processed separately and the corresponding output value is computed. Comparing the produced output image in the PWM approach with the golden image, the mean of the output error rates was 1.28%. Thus, the PWM approach could decrease the average error rate of processing the sample image when the PWM approach is compared with that of the prior stochastic approach with 256-bit streams (1.49%). Considering the delay of the prior stochastic approach (256×0.34 ns=87.04 ns), the PWM approach decreases the processing time of each pixel by more than 98%, to only 1.02 nanoseconds. Even if the quality of the 32-bit streams (1.98%) is enough for the first approach, still the PWM approach has improved the operation time by 90%. Area, power, and energy consumption of the circuit when working with PWM signals are also presented and compared with the prior approach in Table II. From the area, area-delay and energy numbers, the proposed PWM approach has a significant cost advantage when numbers are compared with the prior stochastic approach.

TABLE II

Area, delay, power and energy comparison of the implemented circuits for the conventional binary, prior stochastic, and the proposed PWM approach. For the prior stochastic approach, the cost of the ADC is ignored. Delay and power numbers are reported for maximum working frequency.

| Circuit | Approach | Area ($\mu m^2$) Core | SNG | Output | Total | Delay (ns) | Power ($\mu W$) | Energy (pJ) | Area × delay |
|---|---|---|---|---|---|---|---|---|---|
| Robert | Binary | 1626 | | | 1626 | .78 | 1415 | 1.10 | 1.26 |
| | Prior Stoch. | 22 | 739 | 199 | 960 | 87.04 | 2813 | 244.8 | 83.55 |
| | PWM | 22 | 464 | 110 | 596 | 1.02 | 943 | 0.96 | 0.60 |
| Gamma | Binary | 1980 | | | 1980 | 1.03 | 973 | 1.00 | 2.03 |
| | Prior Stoch. | 76 | 982 | 199 | 1257 | 153.6 | 1672 | 256.8 | 181.4 |
| | PWM | 76 | 678 | 110 | 864 | 1.8 | 1690 | 3.04 | 1.42 |

Compared to the conventional binary implementation, although the PWM approach is slightly slower, it costs 63% less area, dissipates 12% less energy, and reduces the area-delay product by more than 50%. The main barrier to practical use of the prior stochastic implementation was its long latency and correspondingly high energy use. However, as the results presented in Table II show, the proposed PWM approach is able to implement the Robert's cross edge detection algorithm with the advantages of the stochastic design but as fast and energy-efficiently as the conventional binary design.

Experimental results on image processing applications show up to 99% performance speedup, 98% saving in energy dissipation, and 40% area reduction compared to prior stochastic approaches.

A flexible and straight-forward method to utilize SC in different applications is to synthesize the SC circuits with a MUX-based architecture, called ReSC. This design approach is simple and area-efficient, and is able to realize polynomial functions that can be translated to Bernstein Polynomials. The gamma correction function ($f(x)=x^\gamma$) is a popular pixel value transformation that can change luminance and tri-stimulus values in video and image processing systems. This function can be approximated using a Bernstein polynomial. A stochastic implementation of the gamma correction function for $\gamma=0.45$ based on the ReSC architecture is shown in FIG. 16B. The inputs to this system consist of six independent bit streams, each with probability corresponding to the value x of the input pixel (denoted as x in FIG. 16B), as well as seven random bit streams set to constant values, corresponding to the Bernstein coefficients, $b_0=0.0955$, $b_1=0.7207$, $b_2=0.3476$, $b_3=0.9988$, $b_4=0.7017$, $b_5=0.9695$ and $b_6=0.9939$.

For the gamma correction circuit, the same core stochastic logic was used for the first approach and the PWM method, but different input SNGs and output accumulation circuits were used. For the first approach, delayed outputs of the same bit stream may be used to generate multiple bit streams with small correlations. That results in significant area savings to the original implementation. A second LFSR was used for generating the Bernstein coefficients, making a total of two LFSRs and eight comparators to generate all the necessary bit streams in the first (prior stochastic) approach.

For the PWM method, the process of synthesizing the gamma correction circuit may be described as follows. The same process can be easily adapted to implement any other function that can be realized with the ReSC architecture.

With respect to frequency selection, at any time only one input of MUX 1620B is selected to be connected to the output. As a result, the PWM signals corresponding to the Bernstein coefficients can be generated with the same frequency. However, the circuit needs some level of independence between the six PWM signals corresponding to the inputs value of x. Fortunately, providing the required independence does not necessarily need generating signals with different frequencies, as was the case with multiplication. In the prior stochastic approach, such independence could be provided by shifting the x streams for one or a few bits and so having a huge saving in the cost of SNG. Similarly, a phase shift technique can be used for the PWM approach to make independent copies of x. An additional step will select the best set of shift phases for the x signals that can lead to high quality outputs. Synthesis results showed a critical path of 0.60 nanoseconds for the gamma correction circuit. Accordingly, 0.60 nanoseconds was chosen as the period of the x signals and 0.9 as the period of the Bernstein coefficient signals. These periods are the scaled versions of (2 nanoseconds, 3 nanoseconds).

Since the gamma correction circuit is built on a MUX-based architecture, accurate outputs can be produced if the circuit runs for the LCM of the period of the inputs and the period of the PWM signals corresponding to the input x. Thus, the best operation time for the selected periods is their first common multiple or, 1.8 nanoseconds. Using the phase shifting technique does not increase the operation time and highly accurate output can still be produced in LCM time by choosing the phases of the x signals appropriately.

With respect to clock generation, two clock generators may be used for the Gamma correction circuit. One clock generator may be used for generating a clock signal with a period of 0.9 nanoseconds for the Bernstein PWM signals and another one for generating a clock signal with a period of 0.6 nanoseconds. The latter drives the PWM generators responsible for generating x signals. Rings of 79 and 53 inverters were used to generate the required clock signals with periods of 0.9 nanoseconds and 0.6 nanoseconds, respectively.

In the ReSC circuits, the results of adding independent copies of signal x determines which input of MUX 1620B at any time may be connected to the output. Having six similar PWM signals, each signal can be shifted for a phase between zero to the period of the signal. When using a ring of inverters as the clock generator, clock signals with the same frequency but different phases can be extracted from different stages of the ring. The gamma correction circuit needs six clock signals all with a fixed period of 0.6 nanoseconds but each with a different phase. In several trials, the average error rates of processing one thousand random pixels was measured when clock signals with different phases were extracted from different stages of the ring. For the final implementation, the set of ring stages that led to the minimum average error rate was chosen.

The pixels of the sample image were converted to their corresponding PWM signals and then processed by the implemented ReSC-based Gamma correction circuit. The mean of the error rates in processing all pixels of the sample image in the PWM approach was 2.18%, which is very close to the number reported for processing the sample image by the prior stochastic approach. The operation time for processing each image pixel has decreased from 153.6 ns for the first approach to only 1.8 ns in the PWM approach. Also, area-delay cost and energy consumptions are all significantly improved by the PWM approach when compared to the prior stochastic implementation. The cost of the required clock generator was not considered in the prior stochastic approach. If this cost were to be added, the improvement gained by the PWM approach would have been even more.

Comparing the conventional binary implementation of the gamma correction function with the prior stochastic approach, the latency of processing each image pixel, the energy dissipation, and the area-delay product are all significantly increased in the prior stochastic approach. The benefits of the stochastic approach are limited to around a 36% area saving and adding the ability to tolerate noise, which is an inherent property in SC. The PWM approach, on the other hand, not only inherits the noise tolerance advantage of the stochastic design, it also increases the area saving to 56% and bring the latency very close to the latency of the conventional binary design. Although the energy dissipation of the PWM approach is still more than that of the conventional binary design, it is much less than the energy dissipation of the prior stochastic approach.

There are five primary sources of error in performing stochastic operations on PWM signals, including the error in generating the PWM signals ($E_G$). A PWM generator has some inherent inaccuracies in converting real values to corresponding PWM duty cycles. This inaccuracy can be defined as the difference between the expected and the measured duty cycle in the generated signal, as shown in Equation (5).

$$E_G = |D - \frac{1}{T} \times T_{high}| \tag{5}$$

Figure 18:
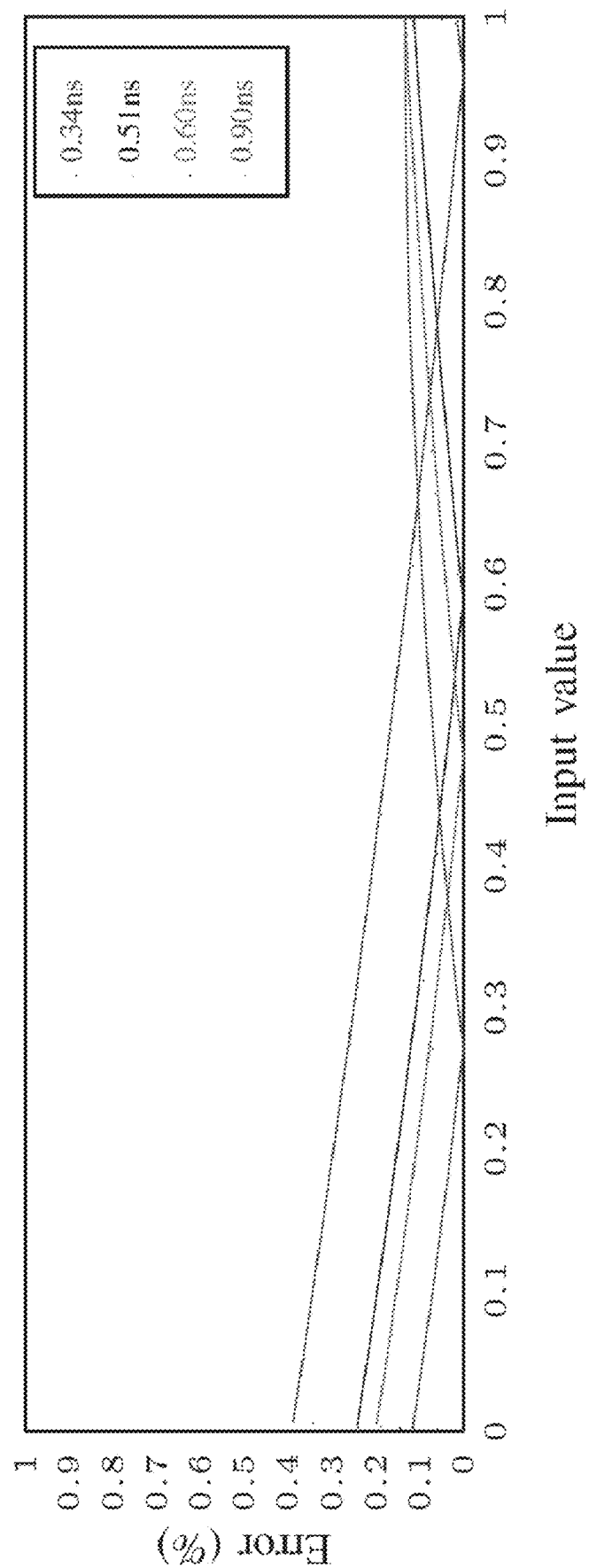
FIG. 18 is a graph of error rate as a function of input value for a PWM generator, in some examples of this disclosure.

FIG. 18 shows the accuracy of the PWM generator used in the simulations in converting real numbers in the interval [0,1] to the corresponding PWM signals. Performance of the PWM generator is a function of the period of the signal and the duty cycle. For example, for small duty cycles reducing the period lowers the accuracy of the generated signals. In simulations, the error introduced in generating PWM signals was always less than 0.4%.

Error due to skew noise ($E_S$) is another form of error in performing stochastic operations on PWM signals. For some stochastic operations, such as absolute value subtraction using XOR gates, perfectly synchronized PWM signals are necessary to produce accurate results. On-chip variations or other noise sources affecting ring oscillators can result in deviations from the expected period, phase shift or the slew rate of the signals. While these variations can affect the accuracy of the output signal, the results are still accurate to within the error bound expected for stochastic computation.

Error in measuring output signals ($E_M$) is a form of error in performing stochastic operations on PWM signals. A simple RC integrator can be used to measure the fraction of the time the output signal is high. Longer rise and fall times and imperfect measurement of the high and low voltages (corresponding to digital one and zero values) results in inaccuracies in measuring the correct output value. The output values measured by the SPICE-level implementation of the integrator were compared with the expected values from measuring the outputs produced by the Robert's cross and Gamma circuit under ideal signal levels when processing sample images. The average error rate of the measurements was 0.16% for the Robert's cross and 0.12% for the Gamma correction circuit.

Error due to truncation ($E_T$) is another source of error in the PWM-based approach if the operation runs for any time other than the required operation time. For example, the multiplication operation must run the LCM or multiples of the LCM of the period of the PWM inputs to generate an accurate output. Running the operation for anytime less or more than the LCMs introduces truncation error.

Error due to function approximation ($E_A$) is another form of error in performing stochastic operations on PWM signals. For functions such as gamma correction, a Bernstein approximation of the function is used to implement the function in the stochastic approach. For most functions approximated by Bernstein polynomials of degree 6, the average approximation error is less than 0.1%. Thus, the overall error, $E_{Total}$, for the stochastic operations performed on PWM signals is bounded by the sum of the above error components, as shown in Equation (6).

$$E_{Total} = E_G + E_S + E_M + E_T + E_A \tag{6}$$

Considering the means of the error rates measured for processing sample images by the synthesized Robert's cross and Gamma correction circuits in the PWM approach, some of these sources of errors could offset or compensate for each other, resulting in an acceptable total error, less than or very close to the error rates measured for the prior approach.

Figure 19:
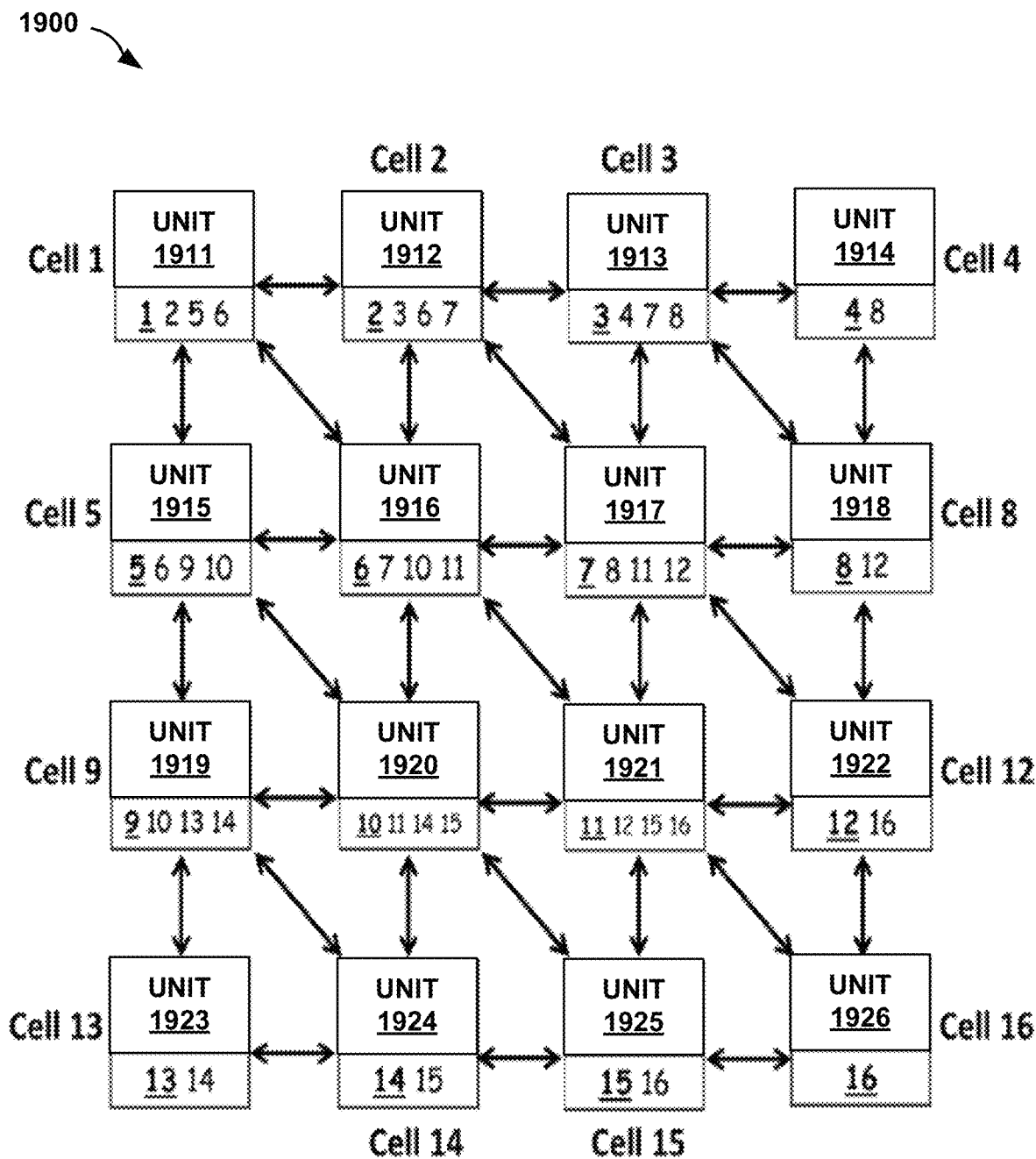
FIG. 19 illustrates sixteen Robert's Cross Cells processing a 4×4 input image concurrently, in some examples of this disclosure.

FIG. 19 illustrates sixteen Robert's Cross Cells (i.e., stochastic processing units 1911-1926) processing a 4×4 input image concurrently, in some examples of this disclosure. FIG. 19 shows a diagram of parallel circuit 1900 illustrating one example application in which deterministic bit streams may be used in more complex integrated circuits, such as image processing circuits. In the example of FIG. 19, an input 4×4 gray-scale image can be processed by a Robert's Cross edge-detection circuit. An efficient way of processing the image may be to use 16 instances of the Robert's Cross circuit to process each of the pixels concurrently. Each cell may be a Robert's Cross cell that converts its input pixel value, presented as a deterministic bit stream, into an output pixel value, presented as deterministic bit stream. The cell may communicate with its neighbor cells to receive their pixel values, presented as deterministic bit streams. In this way, an image processing circuit may be constructed using the techniques described herein so as to process pixel values using stochastic processing units even though data values are conveyed between the stochastic processing units using deterministic bit encodings.

Each of stochastic processing units 1911-1926 may be positioned beneath a pixel of a display. The display may be configured to display a 4×4 image across sixteen or more pixels. Each of stochastic processing units 1911-1926 may output a signal to the respective pixel to cause the pixel to generate the desired light intensity and color.

Figure 20:
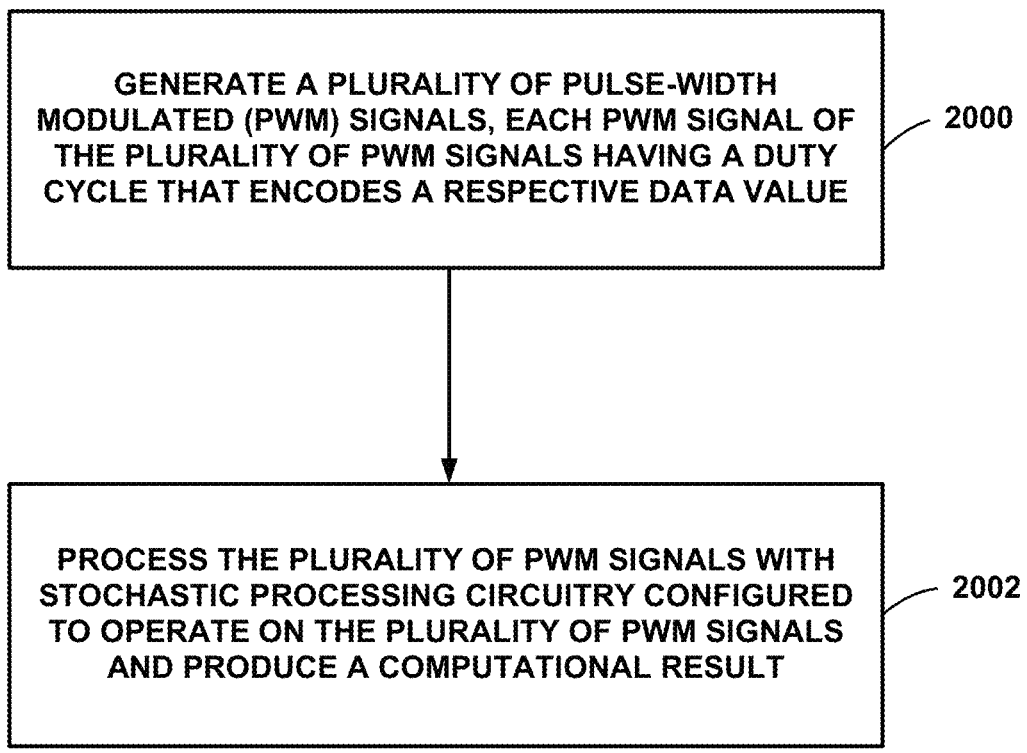
FIG. 20 is flowchart illustrating example techniques for performing computational operations on PWM signals, in accordance with some examples of this disclosure.

FIG. 20 is flowchart illustrating example techniques for performing computational operations on PWM signals, in accordance with some examples of this disclosure. The example techniques of FIG. 20 are described with reference to integrated circuit in FIG. 2, although other components may exemplify similar techniques.

In the example of FIG. 20, PWM generation circuitry 12A-12N generates PWM signals 16A-16N, where each of PWM signals 16A-16N has a duty cycle that encodes a respective data value (2000). PWM generation circuitry 12A-12N may deliver PWM signals 16A-16N to stochastic processing units 10A-10N for processing. In the example of FIG. 20, stochastic processing units 10A-10N process PWM signals 14A-14N and 16A-16N with stochastic processing circuitry by operating on the PWM signals 14A-14N and 16A-16N and producing a computational result (2002). For example, stochastic processing unit 10B may output the computational result of an operation as PWM signals 14B and 14C. The duty cycle of each of PWM signals 14B and 14C may represent a respective data value.

With a stochastic representation, computation has a pseudo analog character, operating on real-valued signals. It may be advantageous to use an analog view on digital values, both from the standpoint of the hardware resources required as well as the error tolerance of the computation. Many of the functions implemented for computational systems such as signal processing are arithmetic functions, consisting of operations like addition and multiplication. Complex functions, such as exponentials and trigonometric functions, are generally computed through polynomial approximations, so through multiplications and additions. Operations such as these can be implemented with remarkably simple hardware in the stochastic paradigm.

The cost incurred is to provide randomness. While randomness is never free, pseudo-randomness often suffices. The strategy proposed herein is to provide a form of pseudo-randomness through time-encoding of signals using pulse width modulation. PWM signals can be constructed with very common and inexpensive analog circuit structures. All of the basic operations discussed in the literature on stochastic computing can be implemented on PWM signals.

Prior approaches to stochastic circuit design suffered from high run-time latency and correspondingly high energy use. Although the hardware cost of the core stochastic logic was negligible compared to the hardware cost of the conventional binary design, expensive stochastic number generators made them area and energy inefficient. With the proposed PWM approach, however, the latency, area and energy dissipation are all greatly reduced compared to the prior stochastic approaches. This new time-encoded approach inherits the fault tolerant advantage of stochastic design while works as fast and energy-efficiently as the conventional binary design. Fault tolerant capability, a lower hardware cost and a smaller area-delay product make the proposed PWM approach a better choice than the conventional binary design.

Growth in digital and video imaging cameras, mobile imaging, biomedical imaging, robotics, and optical sensors has spurred demand for low-cost, energy-efficient circuits for image processing. Stochastic computing has potential in low-cost implementation of image-processing algorithms and video-processing algorithms. Image processing based on time-encoded signals could have significant impact in this application area, particularly when power constraints dominate. Time-encoded, mixed-signal processing can be performed on the same chip, with analog-to-time conversion followed by logical computation on the time-encoded signals, using stochastic constructs.

Mixed-signal design may be attractive for very-large-scale integrated (VLSI) implementations of neural networks (NNs) for reasons of speed and energy efficiency. Also, mixed-signal solutions may not suffer from the quantization effects that arise with analog-to-digital conversion. NNs are computationally complex, which makes NNs a good candidate for processing with low-cost stochastic logic. Digital bitstream-based processing of data in stochastic NN may include running for more than 1,000 clock cycles to achieve an accuracy close to that of conventional deterministic fixed-point binary designs, which then leads to high energy consumption. Time-based stochastic computing has the potential to mitigate these costs, offering energy-efficient designs. Unlike conventional stochastic computing, the computations can be completely accurate with no random fluctuation. The approach could have a significant impact in the design of near-sensor NN accelerators.

Time-based computing is a mixed-signal technology that combines an analog representation in time with digital processing, using stochastic constructs. Analog noise is one possible challenge in the development and application of time-based computing. By properly structuring digital bitstreams, completely deterministic computation can be performed with stochastic logic. The results are completely accurate with no random fluctuations. Due to the mixed-signal nature of time-based processing, computations on time-encoded signals are susceptible to noise, and one hundred percent accuracy is not certain. Analog noise cannot be completely eliminated from signals and therefore from computation. By careful design of ATC and TAC, and by choosing appropriate frequencies, however, the error can be made very low (less than 0.001 percent mean absolute error).

The resolution in time-based processing is limited by noise, rather than by the length of bitstreams. In contrast, the resolution with stochastic computing may be limited by the length of bitstreams. While there is no limit in the resolution of stochastic numbers represented by digital bitstreams, the resolution in the time-encoded approach is limited by the maximum ENOB of the ATC (that is, the PWM generator). For a minimum frequency of 10 MHz, current ATCs can achieve a maximum ENOB of 11 to 12 bits.

With time-encoded signals, operations should run for a specific amount of time to produce correct results. For operations with independent inputs, this time equals the product of the period of the input signals. For operations with correlated inputs, it equals the period of the input signals. Running the operation for longer or shorter than the required time may result in truncation error. In contrast, stochastic bitstreams may have the property of progressive precision, meaning that short subsequences of stochastic numbers can provide low-precision estimates of its value. The longer the stream runs, the more precise the value. Given enough time, the output converges to the expected correct value, and consequently, the truncation error is generally low.

In some examples, operations using synchronized PWM signals may be utilized at only a first level of logic in a circuit. For example, in some applications, providing the required synchronization—that is, having maximal overlap between the high part of the input signals—may be challenging to achieve for the second and higher logic levels. One solution is to convert the output of each level back to an analog format, and then perform an analog-to-time conversion and feed this to a higher level. However, this solution may decrease the accuracy and is costly in terms of latency, area, and energy.

Some operations may require synchronized inputs. On-chip variations or noise sources affecting clock generators can result in deviations from the expected period, phase shift, or slew rate of the signals. Different delays for AND gates and OR gates, for example, can be a source of significant skew in implementing sorting-based circuits. The skew in each stage is propagated to the next, resulting in a considerable skew error for large circuits. Mitigating the skew by delaying some signals may be complex and costly, and may offset gains in area and power.

Relatively prime stream lengths, clock division, and rotation are three methods for processing digital bitstreams deterministically. Choosing inharmonic frequencies for the time-encoded signals corresponds to the "relatively prime" method. A high-frequency time-encoded PWM signal may be connected to the select input of the MUX for an accurate scaled addition operation. This approach corresponds to the "clock division" method. In the "rotation" method, digital bitstreams are stalled for one cycle at powers of the stream length, causing each bit of one bitstream to see each bit of the other stream exactly once. Considering the high working frequency of time-based stochastic computing, stalling PWM signals for a very short and precise amount of time might not be possible.

Additional example details of stochastic computation may be found in U.S. patent application Ser. No. 15/448,997 filed on Mar. 3, 2017, entitled "Stochastic Computation Using Deterministic Bit Streams," and U.S. patent application Ser. No. 15/618,530 filed on Jun. 9, 2017, entitled "Stochastic Computation Using Deterministic Bit Streams," which are incorporated herein by reference in their entirety.

Sequential finite-state machine (FSM)-based approaches exist for implementing complex functions with stochastic computing. These methods depend on randomness in different ways than combinational methods do. It is not clear how to translate these sequential constructs to deterministic computation on time-based PWM signals.

Computation on time-based encodings may offer significant technical advantages over both deterministic and conventional random stream-based stochastic approaches. Computation on time-based encodings generally results in circuits that are much less costly in terms of area and power, particularly for applications where the inputs are presented in analog voltage or current form. The savings in the analog-to-time conversion step compared to a full analog-to-digital conversion are significant. Accordingly, the approach is a good fit for low-power real-time image-processing circuits, such as those in vision chips. Time-based encoding may also be useful for an ultra-low-power video-processing unit and for a low-cost, energy-efficient implementation of convolutional NNs and near-sensor NN accelerators.

Various embodiments of the invention have been described. These and other embodiments are within the scope of the following claims.

The invention claimed is:

1. A device comprising:
   a stochastic processing unit having a first plurality of inputs,
   wherein each input of the first plurality of inputs is configured to receive a respective pulse-width modulated (PWM) signal of a plurality of PWM signals, each of the PWM signals being periodic signals having a respective frequency and period,
   wherein each of the PWM signals encodes a respective data value represented by a time duration of a duty cycle relative to the period of the respective PWM signal, and
   wherein the stochastic processing unit includes stochastic processing circuitry configured to operate on the plurality of PWM signals and produce a computational result.

2. The device of claim 1, further comprising PWM generation circuitry configured to generate the plurality of PWM signals by controlling the time duration of the duty cycle of each PWM signal of the plurality of PWM signals to encode the respective data value.

3. The device of claim 2, wherein the PWM generation circuitry is further configured to generate each PWM signal of the plurality of PWM signals to have different periods.

4. The device of claim 3, wherein the PWM generation circuitry is further configured to select periods for the plurality of PWM signals such that each of the periods are relatively prime with respect to each other period.

5. The device of claim 3, wherein, for each PWM signal of the plurality of PWM signals, the PWM generation circuitry is further configured to repeatedly output a full duty cycle representing the respective data value over a stream length.

6. The device of claim 5, wherein the PWM generation circuitry is further configured to select, for each PWM signal of the plurality of PWM signals, the stream length during which to repeatedly generate and output the full duty cycle of the respective data value based on a least common multiple of the periods selected for all of the plurality of PWM signals.

7. The device of claim 1, wherein the stochastic processing unit is a first stochastic processing unit, the device further comprising:
   a display including a first pixel and a second pixel; and
   a second stochastic processing unit, wherein the first stochastic processing unit is positioned beneath the first pixel, and wherein the second stochastic processing unit is positioned beneath the second pixel.

8. The device of claim 1, wherein the device comprises an integrated circuit, a sensor or an image processor, a video processing circuitry, a camera, or a mobile device.

9. The device of claim 1, further comprising a sensor device, the sensor device comprising:
- a sensing circuit that outputs an analog sense signal indicative of a sensed input;
- a ramp generator configured to receive the analog sense signal and output a ramp signal up to an output voltage set as a function of the analog sense signal;
- an analog comparator having a first input configured to receive the ramp signal from the ramp generator and a second input configured to receive a reference voltage and configured to output, based on a comparison of the ramp signal and the reference voltage, a first PWM signal of the plurality of PWM signals; and
- a clock signal generator outputting a reset clock to reset the analog comparator and control the period for the first PWM signal.

10. The device of claim 9, wherein the clock signal generator is a first clock signal generator, and wherein the analog comparator is a first analog comparator, the sensor device further comprising:
- a second plurality of inputs,
- a second comparator configured to output a second PWM signal of the plurality of the PWM signals; and
- a second clock signal generator configured to control a period of the second PWM signal,
- wherein the first PWM signal encodes a first data value represented by the time duration of the duty cycle of the first PWM signal relative to the time duration of the period of the first PWM signal, and
- wherein the second PWM signal encodes a second data value represented by the time duration of the duty cycle of the second PWM signal relative to the time duration of the period of the second PWM signal.

11. The device of claim 10,
- wherein the first clock signal generator is configured to control the time duration of the duty cycle of the first PWM signal to encode the first data value, and
- wherein the second clock signal generator is configured to control the time duration of the duty cycle of the second PWM signal to encode the second data value.

12. The device of claim 11, wherein the first clock signal generator and the second clock signal generator are further configured to generate the first PWM signal and the second PWM signal to have different periods.

13. The device of claim 11, wherein the first clock signal generator and the second clock signal generator are further configured to select periods for the first PWM signal and the second PWM signal such that each of the periods are relatively prime with respect to each other period.

14. The device of claim 11,
- wherein, for the first PWM signal, the first clock signal generator is further configured to repeatedly output a first full duty cycle representing the first data value over a first stream length, and.
- wherein, for the second PWM signal, the second clock signal generator is further configured to repeatedly output a second full duty cycle representing the second data value over a second stream length.

15. The device of claim 1, wherein the stochastic processing circuitry is configured to operate on the plurality of PWM signals by performing a multiplication operation on the plurality of PWM signals to produce the computation result.

16. A method comprising:
- generating a plurality of pulse-width modulated (PWM) signals, each PWM signal of the plurality of PWM signals generated to encode a respective data value represented by a time duration of a duty cycle relative to a time duration of a period of the respective PWM signal; and
- processing the plurality of PWM signals with stochastic processing circuitry configured to operate on the plurality of PWM signals and produce a computational result.

17. The method of claim 16, wherein generating the plurality of PWM signals comprises controlling the time duration of the duty cycle of each PWM signal of the plurality of PWM signals to encode the respective data value.

18. The method of claim 16, wherein generating the plurality of PWM signals comprises generating each PWM signal of the plurality of PWM signals to have different periods.

19. The method of claim 18, wherein generating the plurality of PWM signals further comprises selecting periods for the plurality of PWM signals such that each of the periods are relatively prime with respect to each other period.

20. The method of claim 18,
- wherein generating the plurality of PWM signals further comprises repeatedly outputting, for each PWM signal of the plurality of PWM signals, a full duty cycle representing the respective data value over a stream length, and
- wherein generating the plurality of PWM signals further comprises selecting, for each PWM signal of the plurality of PWM signals, the stream length during which to repeatedly generate and output the full duty cycle of the respective data value based on a least common multiple of the periods selected for all of the plurality of PWM signals.

* * * * *